(12) United States Patent
Ogawa et al.

(10) Patent No.: US 6,615,394 B2
(45) Date of Patent: Sep. 2, 2003

(54) METHOD AND APPARATUS FOR PREPARING A SIMULATION MODEL FOR SEMICONDUCTOR INTEGRATED CIRCUIT AT POWER TERMINAL FOR SIMULATING ELECTROMAGNETIC INTERFERENCE

(75) Inventors: Masashi Ogawa, Tokyo (JP); Hiroshi Wabuka, Tokyo (JP)

(73) Assignee: NEC Corporation, Tokyo (JP)

( * ) Notice: Subject to any disclaimer, the term of this patent is extended or adjusted under 35 U.S.C. 154(b) by 94 days.

(21) Appl. No.: 09/918,475

(22) Filed: Aug. 1, 2001

(65) Prior Publication Data

US 2002/0157069 A1 Oct. 24, 2002

(30) Foreign Application Priority Data

Apr. 6, 2001 (JP) ........................ 2001-108522

(51) Int. Cl.[7] ................................. G06F 9/45
(52) U.S. Cl. ................... 716/5; 716/5; 716/4
(58) Field of Search ................ 716/4, 5, 6, 7, 716/8, 9, 18, 19, 20; 326/87, 86; 703/18, 19; 323/20, 509

(56) References Cited

U.S. PATENT DOCUMENTS

| 5,852,358 | A | * | 12/1998 | Ehsani ........................ 323/240 |
| 5,898,321 | A | * | 4/1999 | Ilkbahar et al. ................ 326/87 |
| 5,995,732 | A | * | 11/1999 | Murai ............................ 716/5 |
| 5,999,039 | A | * | 12/1999 | Holst et al. .................. 327/532 |
| 6,237,126 | B1 | * | 5/2001 | Bonitz ............................ 716/4 |
| 6,385,565 | B1 | * | 5/2002 | Anderson et al. ............. 703/18 |
| 6,426,632 | B1 | * | 7/2002 | Clunn ........................ 324/509 |

* cited by examiner

*Primary Examiner*—Vuthe Siek
*Assistant Examiner*—Binh C Tat
(74) *Attorney, Agent, or Firm*—Young & Thompson

(57) ABSTRACT

The present invention provides a method of forming a model for a circuit for simulating an electromagnetic interference, the model being described by a combination of at least one variable resistance and at least one load capacitance, wherein a variable resistance value of the at least one variable resistance and a load capacitance value of the at least one load capacitance are obtained based on at least one current flowing through at least one current path between at least one set of power terminals.

27 Claims, 28 Drawing Sheets

FIG. 19

```
rr1 vcc out r1(t)=(v(vcc)(t)-v(out)(t))/ir1(t)

rr2 out vss r2(t)=(v(out)(t)-v(vss)(t))/ir2(t)

ir1(t) table(
+    t1 I1
+    t2 I2
+    t3 I3
+     ⋮
             )
ir2(t) table(
+    ta Ia
+    tb Ib
+    tc Ic
+     ⋮
             )

cc1 vcc out   C1
cc2 out vss   C2
```

FIG. 21

```
iex table(
+  t1 i1
+  t2 i2
+  t3 i3
+  t4 i4
    ⋮
+  tn in)
```

FIG. 23

| t[ns] | I[A] |
|---|---|
| 0 | 0 |
| 0.5 | 1.65 |
| 1.0 | 0 |
| 5.0 | 0 |
| 5.5 | 1.32 |
| 6.0 | 0 |
| 10.0 | 0 |

FIG. 25

```
rr1 vcc out r1(t)=(v(vcc)(t)-v(out)(t))/ir1(t)

rr2 out vss r2(t)=(v(out)(t)-v(vss)(t))/ir2(t)

ir1(t) table(
+   0.0ns    0.0A
+   0.5ns    2.97A
+   1.0ns    0.0A
+  10.0ns    0.0A
+  10.5ns    2.97A
+  11.0ns    0.0A
+  20.0ns    0.0A)

ir2(t) table(
+   5.0ns    0.0A
+   5.5ns    2.97A
+   6.0ns    0.0A
+  15.0ns    0.0A
+  15.5ns    2.97A
+  16.0ns    0.0A
+  20.0ns    0.0A)

cc1 vcc out 200pF
cc2 out vss 250pF
```

METHOD AND APPARATUS FOR PREPARING A SIMULATION MODEL FOR SEMICONDUCTOR INTEGRATED CIRCUIT AT POWER TERMINAL FOR SIMULATING ELECTROMAGNETIC INTERFERENCE

BACKGROUND OF THE INVENTION

1. Field of the Invention

The present invention relates to a method and an apparatus for preparing a simulation model for a semiconductor integrated circuit at power terminals for simulating an electromagnetic interference to the semiconductor integrated circuit, wherein the simulation model is described in a format of variable resistances and load capacitors in order to represent variation in current flowing at power terminal under conditions of constant direct current voltage and variable resistance.

2. Description of the Related Art

Electromagnetic interference appears from a printed circuit board mounted on an electronic device. The main factor of the electromagnetic interference is high frequency currents or radio frequency currents flowing over the printed circuit board, particularly high frequency currents or radio frequency currents from a power terminal of the semiconductor integrated circuit. It is necessary for countermeasure against the electromagnetic interference to estimate the high frequency current flowing through a power layer of the printed circuit board, wherein the estimation is made in the design stage. In order to estimate the high frequency current, it is necessary to use a simulation model for the semiconductor integrated circuit at the power terminal.

A first conventional method of preparing the simulation model for the semiconductor integrated circuit at the power terminal is disclosed in Technical Report Of IEICE EMCJ 99-103 (1999-12) entitled "A New Model Of LSI At Power terminal For EMI Simulation". FIG. 1 is a circuit diagram illustrative of a first conventional model for the semiconductor integrated circuit at the power terminal for simulating the electromagnetic interference shown in the above literature.

The first conventional model includes a first power terminal 7, a second power terminal 8, a first series connection of a first variable resistance 2 and a second variable resistance 3 between the first and second power terminals 7 and 8, a second series connection of a first load capacitor 4 and a second load capacitor 5 between the first and second power terminals 7 and 8, and an internal output terminal 6. The first and second series connections are parallel to each other between the first and second power terminals 7 and 8.

The internal output terminal 6 is connected to an intermediate node between the first and second variable resistances 2 and 3, and also connected to another intermediate node between the first and second load capacitors 4 and 5. The first variable resistance 2 is connected in series between the internal output terminal 6 and the first power terminal 7. The second variable resistance 3 is connected in series between the internal output terminal 6 and the second power terminal 8. The first load capacitor 4 is connected in series between the internal output terminal 6 and the first power terminal 7. The second load capacitor 5 is connected in series between the internal output terminal 6 and the second power terminal 8.

Variations in resistances of the first and second variable resistances 2 and 3 result in variations of a first current at the first power terminal 7 and a second current at the second power terminal 8. The variation of the first current at the first power terminal 7 is used to estimate a first electromagnetic interference from the first power terminal 7. The variation of the second current at the second power terminal 8 is used to estimate a second electromagnetic interference from the second power terminal 8.

FIG. 2 is a circuit diagram illustrative of a second conventional model for the semiconductor integrated circuit at the power terminal for simulating the electromagnetic interference shown in the above literature. The second conventional model includes a first power terminal 7, a second power terminal 8A a first series connection of a p-channel MOS field effect transistor 38 representing a first variable resistance and a n-channel MOS field effect transistor 39 representing a second variable resistance between the first and second power terminals 7 and 8, a second series connection of a first load capacitor 4 and a second load capacitor 5 between the first and second power terminals 7 and 8, and an internal output terminal 6. The first and second series connections are parallel to each other between the first and second power terminals 7 and 8.

The internal output terminal 6 is connected to an intermediate node between the p-channel and n-channel MOS field effect transistors 38 and 39 representing first and second variable resistances, and also another intermediate node between the first and second load capacitors 4 and 5. The p-channel MOS field effect transistor 38 representing the first variable resistance is connected in series between the internal output terminal 6 and the first power terminal 7. The n-channel MOS field effect transistor 39 representing the second variable resistance is connected in series between the internal output terminal 6 and the second power terminal 8. The first load capacitor 4 is connected in series between the internal output terminal 6 and the first power terminal 7. The second load capacitor 5 is connected in series between the internal output terminal 6 and the second power terminal 8.

A pulse signal generator 37 is connected in series between the second power terminal 8 and gate electrodes of the p-channel and n-channel MOS field effect transistors 38 and 39. The pulse signal generator 37 generates a pulse signal which is applied to the gate electrodes of the p-channel and n-channel MOS field effect transistors 38 and 39 for controlling ON-OFF operations of the n-channel and n-channel MOS field effect transistors 38 and 39.

The ON-OFF operations of the p-channel and n-channel MOS field effect transistors 38 and 39 vary first and second variable resistances, resulting in variations of a first current at the first power terminal 7 and a second current at the second power terminal 8. The variation of the first current at the first power terminal 7 is associated with a first electromagnetic interference at the first power terminal 7. The variation of the second current at the second power terminal 8 is associated with a second electromagnetic interference at the second power terminal 8.

FIGS. 3A and 3B are views of a method of preparing a model for a semiconductor integrated circuit at power terminal for simulating an electromagnetic interference, wherein variable resistances are described by use of transistors From all circuit informations 40 for LSI, only a clock signal system 41 is extracted because a power current of logic based CMOS LSI dominates on the clock signal system. With reference to FIG. 3B, all of the transistors and all of the load capacitors operating in the same timing are respectively modeled into a single transistor model and a single load capacitor model, whereby a simulation circuit model 42 is obtained from the clock signal circuit system 41.

There had not yet been realized a perfect automatic tool for preparing the simulation model of the circuit from the all circuit informations of the semiconductor integrated circuit. This perfect automatic tool needs an extremely high arithmetic processing capability of the computer. In the past, it is manually carried out that the clock signal circuit system is extracted from the huge amount of all data for the all circuit informations of the semiconductor integrated circuit, and then the extracted clock signal circuit system is made into the circuit model for simulation. It is, however, difficult to prepare the variable resistance model described with transistor as shown in FIG. 3B.

In the above circumstances, it had been required to develop a novel method free from the above problem for preparing a simulation model for a semiconductor integrated circuit at power terminals for simulating an electromagnetic interference to the semiconductor integrated circuit, wherein the simulation model is described in a format of variable resistances and load capacitors.

SUMMARY OF THE INVENTION

Accordingly, it is an object of the present invention to provide a novel method free from the above problems for preparing a simulation model for a semiconductor integrated circuit at power terminals for simulating an electromagnetic interference to the semiconductor integrated circuit, wherein the simulation model is described in a format of variable resistances and load capacitors.

It is a further object of the present invention to provide a novel method for automatically preparing a simulation Model for a semiconductor integrated circuit at power terminals for simulating an electromagnetic interference to the semiconductor integrated circuit, wherein the simulation model is described in a format of variable resistances and load capacitors.

It is another object of the present invention to provide a novel computer program free from the above problems for preparing a simulation model for a semiconductor integrated circuit at power terminals for simulating an electromagnetic interference to the semiconductor integrated circuit, wherein the simulation model is described in a format of variable resistances and load capacitors.

It is a further object of the present invention to provide a novel computer program for automatically preparing a simulation model for a semiconductor integrated circuit at power terminals for simulating an electromagnetic interference to the semiconductor integrated circuit, wherein the simulation model is described in a format of variable resistances and load capacitors.

It is another object of the present invention to provide a novel simulation model for a semiconductor integrated circuit at power terminals for simulating an electromagnetic interference to the semiconductor integrated circuit, wherein the simulation model is described in a format of variable resistances and load capacitors.

It is a further object of the present invention to provide a novel simulation model for a semiconductor integrated circuit at power terminals for simulating an electromagnetic interference to the semiconductor integrated circuit, wherein the simulation model is described in a format of variable resistances and load capacitors.

The present invention provides a method of forming a model for a circuit for simulating an electromagnetic interference, the model being described by a combination of at least one variable resistance and at least one load capacitance, wherein a variable resistance value of the at least one variable resistance and a load capacitance value of the at least one load capacitance are obtained based on at least one current flowing through at least one current path between at least one set of power terminals.

The model for the circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures. This allows the maker to present the model to the user.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 19 is a view of a model template described in text-format which corresponds to the model shown in FIG. 9.

FIG. 21 is a view of a table information included in the template shown in FIG. 19.

FIG. 23 is a diagram illustrative of a table for respective current values over times for current waveforms stored in the data base of the system shown in FIG. 18.

FIG. 25 is a diagram of a model outputted from an output device.

DETAILED DESCRIPTION OF THE PREFERRED EMBODIMENTS

Figure 1:
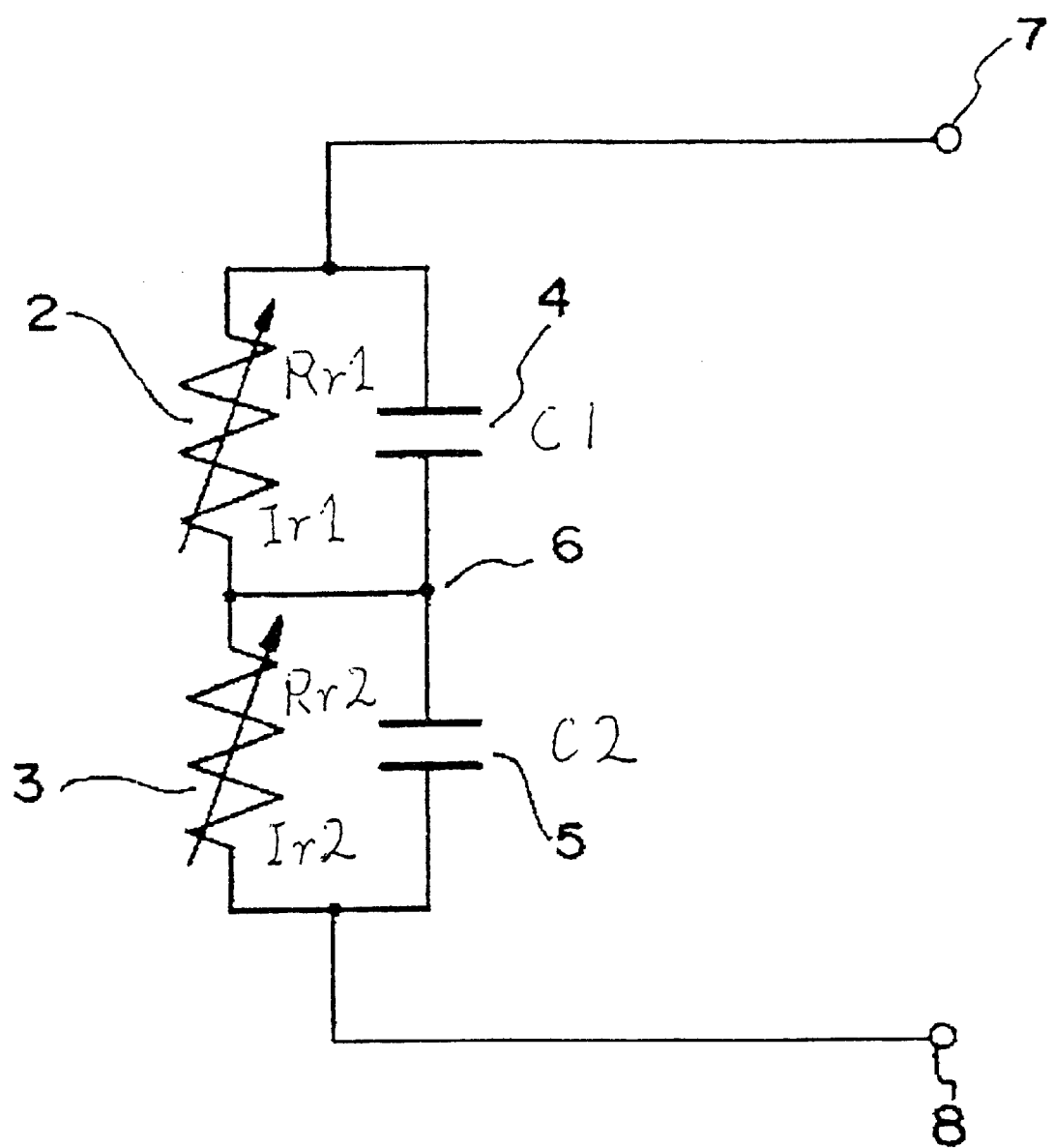
FIG. 1 is a circuit diagram illustrative of a first conventional model for the semiconductor integrated circuit at the power terminal for simulating the electromagnetic interference shown in the above literature.
Figure 2:
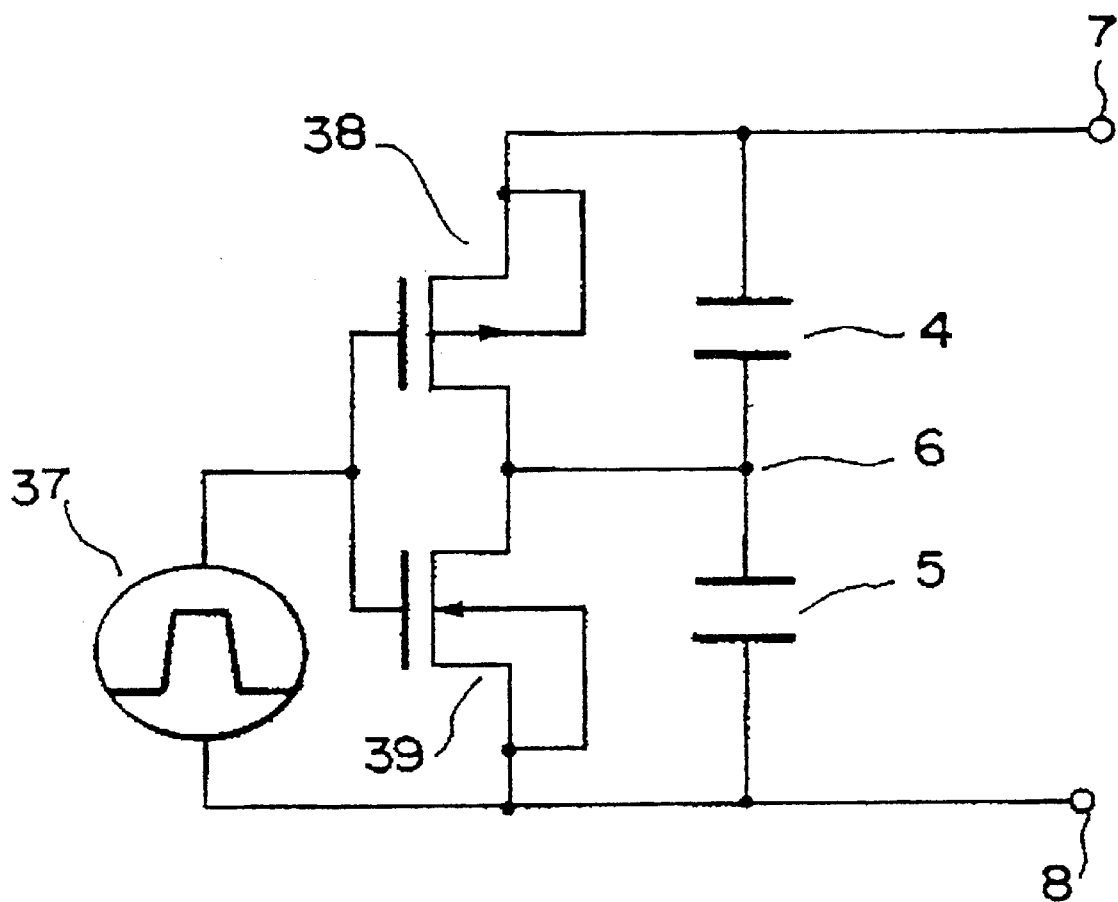
FIG. 2 is a circuit diagram illustrative of a second conventional model for the semiconductor integrated circuit at the power terminal for simulating the electromagnetic interference shown in the above literature.
Figure 3A:
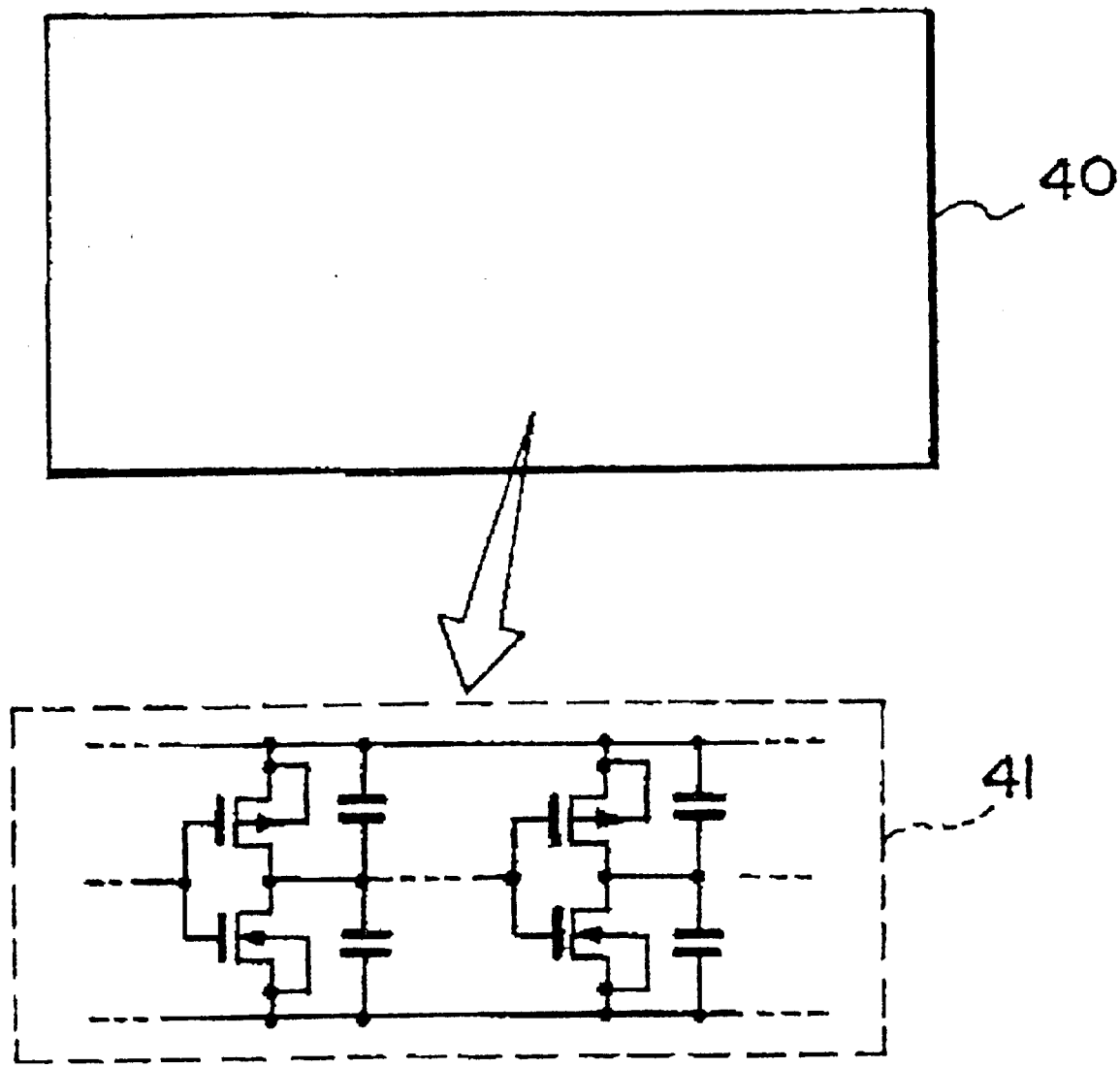
FIGS. 3A and 3B are views of a method of preparing a model for a semiconductor integrated circuit at power terminal for simulating an electromagnetic interference, wherein variable resistances are described by use of transistors.
Figure 3B:
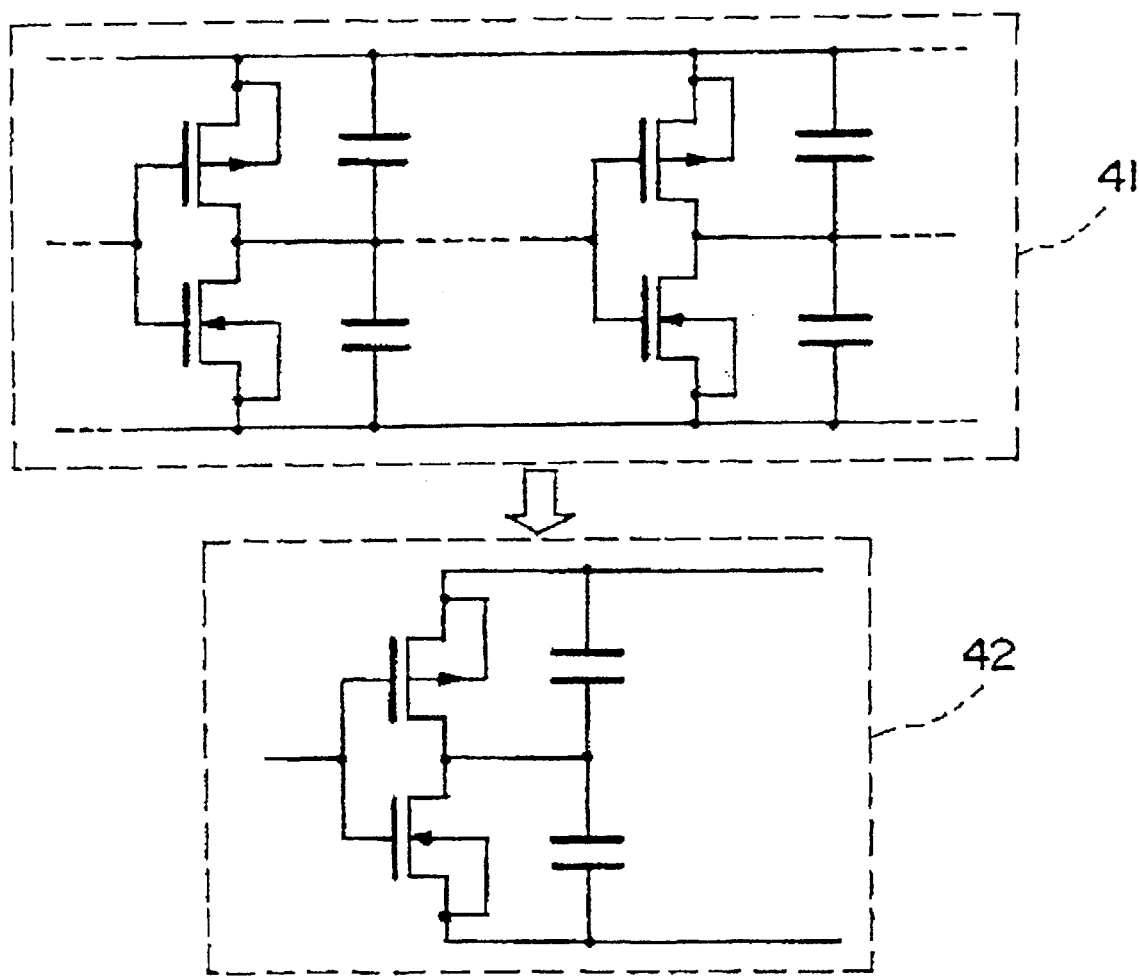

A first aspect of the present invention is a method of forming a model for a circuit for simulating an electromagnetic interference, the model being described by a combination of at least one variable resistance and at least one load capacitance, wherein a variable resistance value of the at least one variable resistance and a load capacitance value of the at least one load capacitance are obtained based on at least one current flowing through at least one current path between at least one set of power terminals.

The model for the circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures. This allows the maker to present the model to the use.

It is preferable that the model includes at least one set of first and second power terminals; a first series connection of first and second variable resistances between the first and second power terminals; a second series connection of first and second load capacitances between the first and second power terminals, and a first intermediate node between the first and second variable resistances being connected to a second intermediate node between the first and second load capacitances, wherein a first variable resistance value of the first variable resistance and a second load capacitance value of the second load capacitance are obtained based on a first current which flows from the first power terminal through the first variable resistance and the second load capacitance to the second power terminal, and wherein a second variable resistance value of the second variable resistance and a first load capacitance value of the first load capacitance are obtained based on a second current which flows from the first power terminal through the first load capacitance and the second variable resistance and to the second power terminal.

It is also preferable that the first load capacitance value is obtained by the step of: integrating the second current over time to obtain a charge quantity; and dividing the charge quantity with a direct current voltage between the first and second power terminals, and wherein the second load capacitance value is obtained by the step of: integrating the first current over time to obtain a charge quantity; and dividing the charge quantity with a direct current voltage between the first and second power terminals.

It is preferable that a current Ir1(t) flowing through the first variable resistance and a current Ir2(t) flowing through the second variable resistance are obtained from equations (1) and (2), $$Ir1(t)=I1(t)\times(C1+C2)/C2 \qquad (1)$$

$$Ir2(t)=I2(t)\times(C1+C2)/C1 \qquad (2)$$

where C1 and C2 are first and second load capacitance values of the first and second load capacitances, and wherein a resistance Rr1(t) of the first variable resistance and a resistance Rr2(t) of the second variable resistance are obtained from equations (3) and (4), $$Rr1(t)=V1(t)/Ir1(t) \qquad (3)$$

$$Rr2(t)=V2(t)/Ir2(t) \qquad (4)$$

where V1 is a voltage across the first variable resistance and V2 is a voltage across the second variable resistance.

It is preferable that the model further includes: a first switch between the first load capacitance and the first power terminal; a second switch between the second load capacitance and the second power terminal; a first by-pass in parallel to the first load capacitance, and the first by-pass comprising a series connection of a third switch and a first constant resistance; a second by-pass in parallel to the second load capacitance, and the second by-pass comprising a series connection of a fourth switch and a second constant resistance; and a controller electrically coupled to the first to fourth switches for controlling ON-OFF operations of the first to fourth switches.

It is preferable that a resistance Rrd1(t) of the first variable resistance and a resistance Rrd2(t) of the second variable resistance are obtained from equations (5) and (6), $$Rrd1(t)=V1(t)/I1(t) \quad (5)$$

$$Rrd2(t)=V2(t)/I2(t) \quad (6)$$

where V1 is a voltage across the first variable resistance and V2 is a voltage across the second variable resistance, and I1(t) is the first current, and I2(t) is the second current.

It is preferable that plural sets of the first and second currents appear in one cycle, and the same number of models as the plural sets are prepared, wherein one of the models is prepared from corresponding one of the plural sets, and the models are connected in parallel to each other between the first and second power terminals.

It is preferable that the circuit is divided into a plurality of sub-blocks, and the same number of models as the sub-blocks are prepared, and the models correspond to the sub-blocks respectively.

It is preferable that the circuit has a plurality of different power systems, and the circuit is divided into the same number of sub-blocks as the power systems, and the sub-blocks correspond to the power systems, and the same number of models as the sub-blocks are prepared, and the models correspond to the sub-blocks respectively.

It is preferable that the circuit comprises a semiconductor integrated circuit.

A second aspect of the present invention is a model for a circuit for simulating an electromagnetic interference, the model being described by a combination of at least one variable resistance and at least one load capacitance, wherein a variable resistance value of the at least one variable resistance and a load capacitance value of the at least one load capacitance depends on at least one current flowing through at least one current path between at least one set of power terminals.

The model for the circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures. This allows the maker to present the model to the user.

It is preferable that the model includes at least one set of first and second power terminals; a first series connection of first and second variable resistances between the first and second power terminals; a second series connection of first and second load capacitances between the first and second power terminals, and a first intermediate node between the first and second variable resistances being connected to a second intermediate node between the first and second load capacitances, wherein a first variable resistance value of the first variable resistance and a second load capacitance value of the second load capacitance depend on a first current which flows from the first power terminal through the first variable resistance and the second load capacitance to the second power terminal, and wherein a second variable resistance value of the second variable resistance and a first load capacitance value of the first load capacitance depend on a second current which flows from the first power terminal through the first load capacitance and the second variable resistance and to the second power terminal.

It is preferable that wherein the first load capacitance value is obtained by the step of: integrating the second current over time to obtain a charge quantity; and dividing the charge quantity with a direct current voltage between the first and second power terminals, and wherein the second load capacitance value is obtained by the step of: integrating the first current over time to obtain a charge quantity; and dividing the charge quantity with a direct current voltage between the first and second power terminals.

It is preferable that wherein a current Ir1(t) flowing through the first variable resistance and a current Ir2(t) flowing through the second variable resistance depend on equations (1) and (2), $$Ir1(t)=I1(t)\times(C1+C2)/C2 \quad (1)$$

$$Ir2(t)=I2(t)\times(C1+C2)/C1 \quad (2)$$

where C1 and C2 are first and second load capacitance values of the first and second load capacitances, and wherein a resistance Rr1(t) of the first variable resistance and a resistance Rr2(t) of the second variable resistance depend on equations (3) and (4), $$Rr1(t)=V1(t)/Ir1(t) \quad (3)$$

$$Rr2(t)=V2(t)/Ir2(t) \quad (4)$$

where V1 is a voltage across the first variable resistance and V2 is a voltage across the second variable resistance.

It is preferable that the model further includes: a first switch between the first load capacitance and the first power terminal; a second switch between the second load capacitance and the second power terminal; a first by-pass in parallel to the first load capacitance, and the first by-pass comprising a series connection of a third switch and a first constant resistance; a second by-pass in parallel to the second load capacitance, and the second by-pass comprising a series connection of a fourth switch and a second constant resistance; and a controller electrically coupled to the first to fourth switches for controlling ON-OFF operations of the first to fourth switches.

It is preferable that a resistance Rrd1(t) of the first variable resistance and a resistance Rrd2(t) of the second variable resistance depend on equations (5) and (6), $$Rrd1(t)=V1(t)/I1(t) \quad (5)$$

$$Rrd2(t)=V2(t)/I2(t) \quad (6)$$

where V1 is a voltage across the first variable resistance and V2 is a voltage across the second variable resistance, and I1(t) is the first current, and I2(t) is the second current.

It is preferable that plural sets of the first and second currents appear in one cycle, and the same number of models as the plural sets are present, wherein one of the models is present in correspondence with the plural sets, and the models are connected in parallel to each other between the first and second power terminals.

It is preferable that the circuit is divided into a plurality of sub-blocks, and the same number of models as the sub-blocks are present, and the models correspond to the sub-blocks respectively.

It is preferable that the circuit has a plurality of different power systems, and the circuit is divided into the same number of sub-blocks as the power systems, and the sub-blocks correspond to the power systems, and the same number of models as the sub-blocks are present, and the models correspond to the sub-blocks respectively.

It is preferable that the circuit comprises a semiconductor integrated circuit.

A third aspect of the present invention is a computer program for forming a model for a circuit for simulating an electromagnetic interference, the model being described by a combination of at least one variable resistance and at least one load capacitance, wherein a variable resistance value of the at least one variable resistance and a load capacitance value of the at least one load capacitance are obtained based on at least one current flowing through at least one current path between at least one set of power terminals.

The model for the circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures. This allows the maker to present the model to the user.

It is preferable that the model includes at least one set of first and second power terminals; a first series connection of first and second variable resistances between the first and second power terminals a second series connection of first and second load capacitances between the first and second power terminals, and a first intermediate node between the first and second variable resistances being connected to a second intermediate node between the first and second load capacitances, wherein a first variable resistance value of the first variable resistance and a second load capacitance value of the second load capacitance are obtained based on a first current which flows from the first power terminal through the first variable resistance and the second load capacitance to the second power terminal, and wherein a second variable resistance value of the second variable resistance and a first load capacitance value of the first load capacitance are obtained based on a second current which flows from the first power terminal through the first load capacitance and the second variable resistance and to the second power terminal.

It is preferable that wherein the first load capacitance value is obtained by the step of: integrating the second current over time to obtain a charge quantity; and dividing the charge quantity with a direct current voltage between the first and second power terminals, and wherein the second load capacitance value is obtained by the step of: integrating the first current over time to obtain a charge quantity; and dividing the charge quantity with a direct current voltage between the first and second power terminals.

It is preferable that a current Ir1(t) flowing through the first variable resistance and a current Ir2(t) flowing through the second variable resistance are obtained from equations (1) and (2), $$Ir1(t)=I1(t)\times(C1+C2)/C2 \quad (1)$$

$$Ir2(t)=I2(t)\times(C1+C2)/C1 \quad (2)$$

where C1 and C2 are first and second load capacitance values of the first and second load capacitances, and wherein a resistance Rr1(t) of the first variable resistance and a resistance Rr2(t) of the second variable resistance are obtained from equations (3) and (4), $$Rr1(t)=V1(t)/Ir1(t) \quad (3)$$

$$Rr2(t)=V2(t)/Ir2(t) \quad (4)$$

where V1 is a voltage across the first variable resistance and V2 is a voltage across the second variable resistance.

It is preferable that the model further includes: a first switch between the first load capacitance and the first power terminal; a second switch between the second load capacitance and the second power terminal; a first by-pass in parallel to the first load capacitance, and the first by-pass comprising a series connection of a third switch and a first constant resistance; a second by-pass in parallel to the second load capacitance, and the second by-pass comprising a series connection of a fourth switch and a second constant resistance; and a controller electrically coupled to the first to fourth switches for controlling ON-OFF operations of the first to fourth switches.

It is preferable that a resistance Rrd1(t) of the first variable resistance and a resistance Rrd2(t) of the second variable resistance are obtained from equations (5) and (6), $$Rrd1(t)=V1(t)/I1(t) \quad (5)$$

$$Rrd2(t)=V2(t)/I2(t) \quad (6)$$

where V1 is a voltage across the first variable resistance and V2 is a voltage across the second variable resistance, and I1(t) is the first current, and I2(t) is the second current.

It is preferable that plural sets of the first and second currents appear in one cycle, and the same number of models as the plural sets are prepared, wherein one of the models is prepared from corresponding one of the plural sets, and the models are connected in parallel to each other between the first and second power terminals.

It is preferable that the circuit is divided into a plurality of sub-blocks, and the same number of models as the sub-blocks are prepared, and the models correspond to the sub-blocks respectively.

It is preferable that the circuit has a plurality of different power systems, and the circuit is divided into the same number of sub-blocks as the power systems, and the sub-blocks correspond to the power systems, and the same number of models as the sub-blocks are prepared, and the models correspond to the sub-blocks respectively.

It is preferable that the circuit comprises a semiconductor integrated circuit.

First Embodiment

Figure 4:
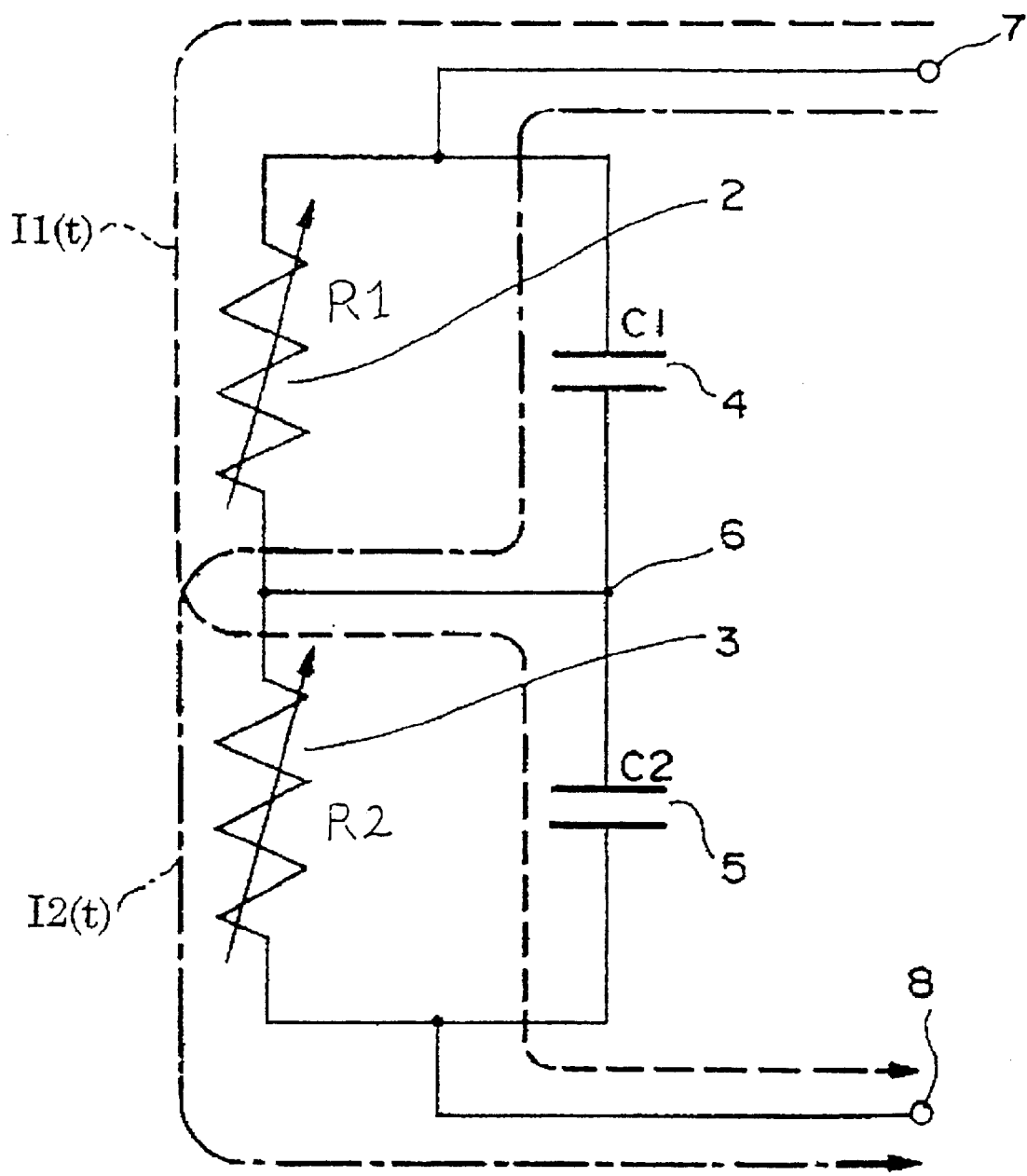
FIG. 4 is a circuit diagram illustrative of a first novel model for the semiconductor integrated circuit at the power terminal for simulating the electromagnetic interference in a first embodiment according to the present invention.

A first embodiment according to the present invention will be described in detail with reference to the drawings. FIG. 4 is a circuit diagram illustrative of a first novel model for the semiconductor integrated circuit at the power terminal for simulating the electromagnetic interference in a first embodiment according to the present invention.

The first novel model includes a first power terminal 7, a second power terminal 8, a first series connection of a first variable resistance 2 and a second variable resistance 3 between the first and second power terminals 7 and 8, a second series connection of a first load capacitor 4 and a second load capacitor 5 between the first and second power terminals 7 and 8, and an internal output terminal 6. The first and second series connections are parallel to each other between the first and second power terminals 7 and 8.

The internal output terminal 6 is connected to an intermediate node between the first and second variable resistances 2 and 3, and also connected to another intermediate node between the first and second load capacitors 4 and 5.

The first variable resistance 2 is connected in series between the internal output terminal 6 and the first power terminal 7. The second variable resistance 3 is connected in series between the internal output terminal 6 and the second power terminal 8. The first load capacitor 4 is connected in series between the internal output terminal 6 and the first power terminal 7. The second load capacitor 5 is connected in series between the internal output terminal 6 and the second power terminal 8. The first and second load capacitors 4 and 5 have capacitances C1 and C2.

Variations in resistances of the first and second variable resistances 2 and 3 result in variations of a first current at the first power terminal 7 and a second current at the second power terminal 8. The variation of the first current at the first power terminal 7 is used to estimate a first electromagnetic interference from the first power terminal 7. The variation of the second current at the second power terminal 8 is used to estimate a second electromagnetic interference from the second power terminal 8.

Figure 5:
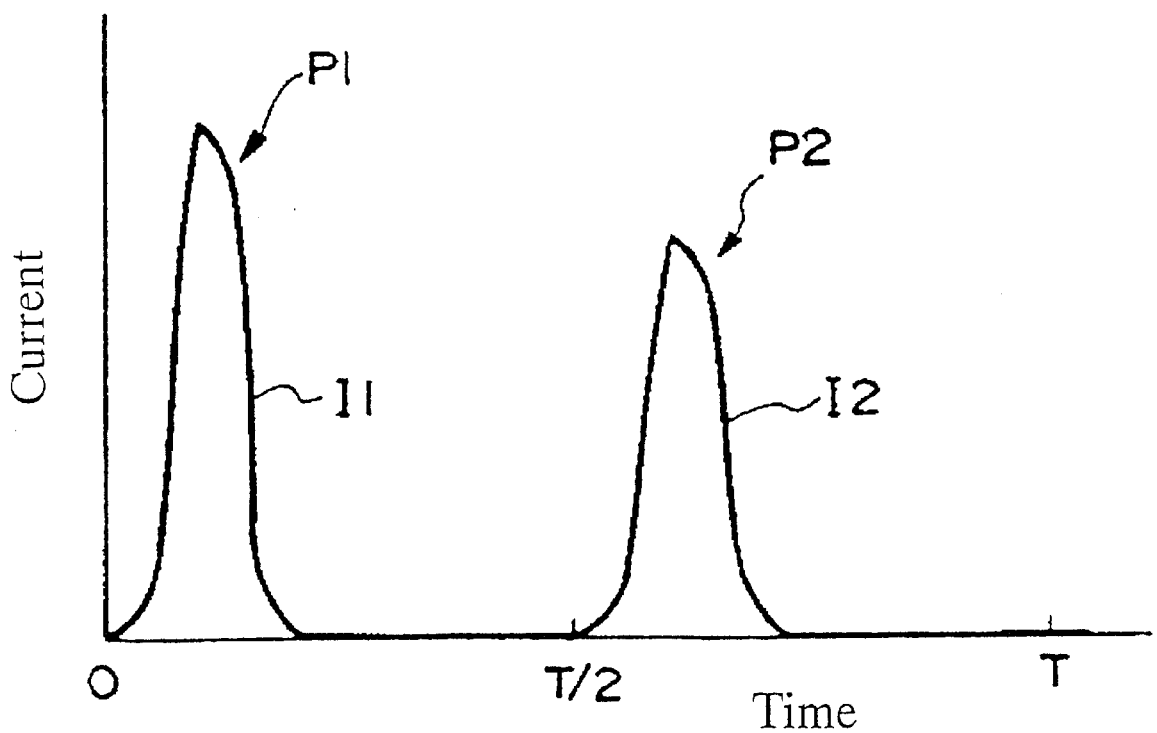
FIG. 5 is a diagram illustrative of time-variation in first and second currents 11 and 12 between the first and second power terminals of the model of FIG. 4.

FIG. 5 is a diagram illustrative of time-variation in first and second currents I1 and I2 between the first and second power terminals of the model of FIG. 4. A first current I1 is a current from the first power terminal 7 through the first variable resistance 2 and the second load capacitance 5 to the second power terminal 8. A second current I2 is a current from the first power terminal 7 through the first load capacitance 4 and the second variable resistance 3 to the second power terminal 8. The first current I1 has a first peak P1. The second current I2 has a second peak P2.

A first resistance value R1 of the first variable resistance 2 and a second capacitance value C2 of the second load capacitance 5 are founded based on the first waveform P1 of the first current I1. A second resistance value R2 of the second variable resistance 3 and a first capacitance value C1 of the first load capacitance 4 are founded based on the second waveform P2 of the second current I2.

The first and second capacitance values C1 and C2 of the first and second load capacitances 4 and 5 are founded based on the first and second waveforms P1 and P2 of the first and second currents I1 and I2 in accordance with the following method.

Figure 6:
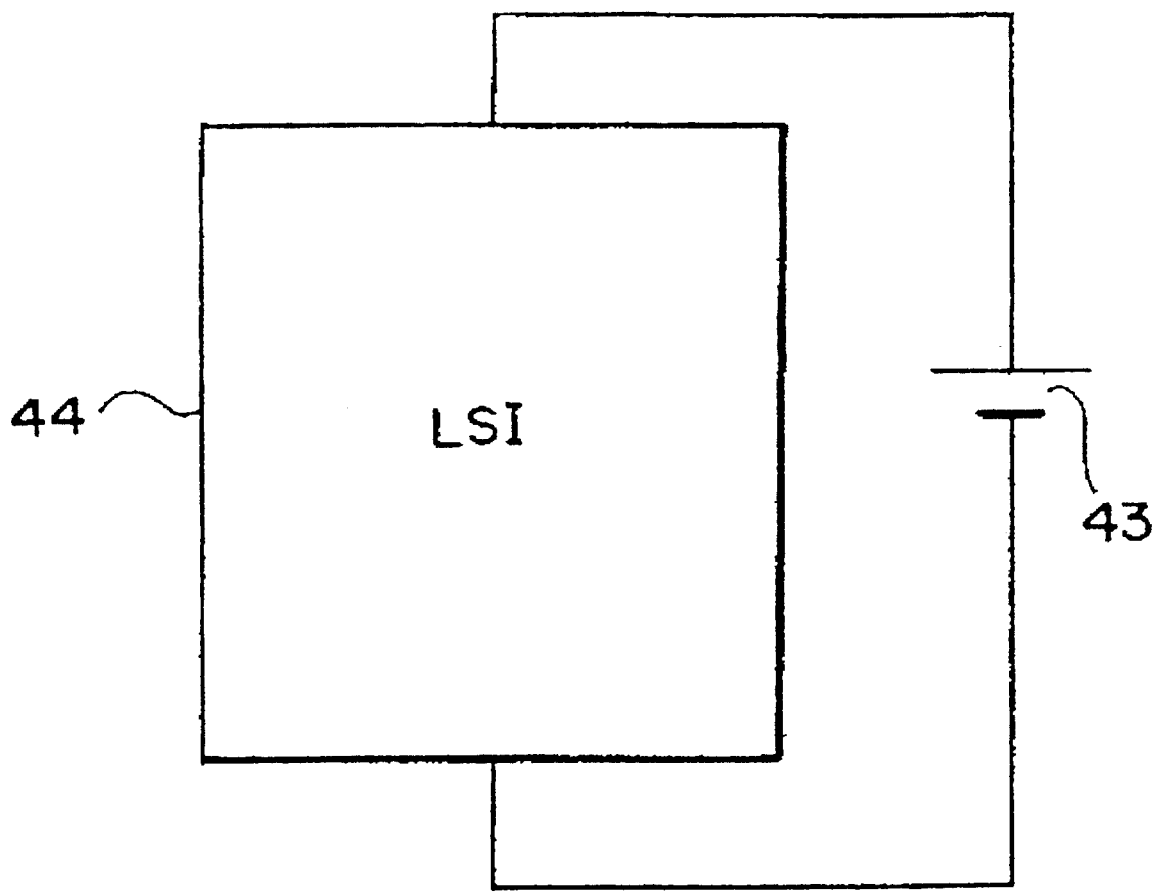
FIG. 6 is a diagram illustrative of a simple model used for finding the first and second waveforms P1 and P2 of the first and second currents I1 and I2 of FIG. 5.
Figure 7:
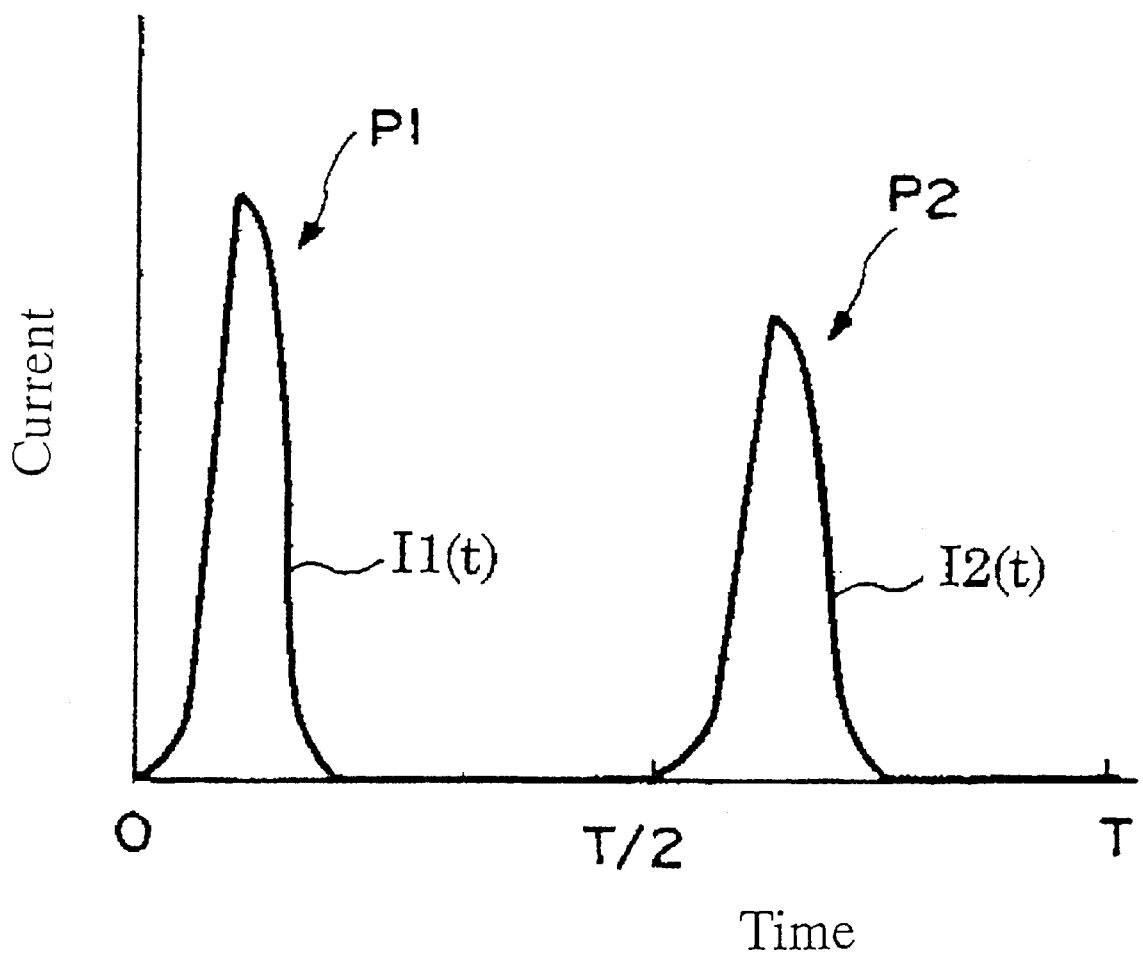
FIG. 7 is a diagram illustrative of first and second waveforms P1 and P2 of first and second currents in one cycle in the simple model of FIG. 6.

The first and second waveforms P1 and P2 of the first and second currents I1 and I2 are founded by use of a simple model, wherein an LSI 44 is connected to a constant direct current power source 43. FIG. 6 is a diagram illustrative of a simple model used for finding the first and second waveforms P1 and P2 of the first and second currents I1 and I2 of FIG. 5. FIG. 7 is a diagram illustrative of first and second waveforms P1 and P2 of first and second currents in one cycle in the simple model of FIG. 6. The one cycle waveform includes both the first and second waveforms P1 and P2.

If all the circuit informations of the LSI 44 are huge, then it is possible that the LSI 44 may be divided into plural sub-blocks, so that respective currents at power terminal are founded for respective plural sub-blocks, and then the sum of the respective currents is founded to form first and second waveforms. It is preferable for obtaining the waveforms that the load is not connected to the power system because the load provides an influence to the model.

Figure 8:
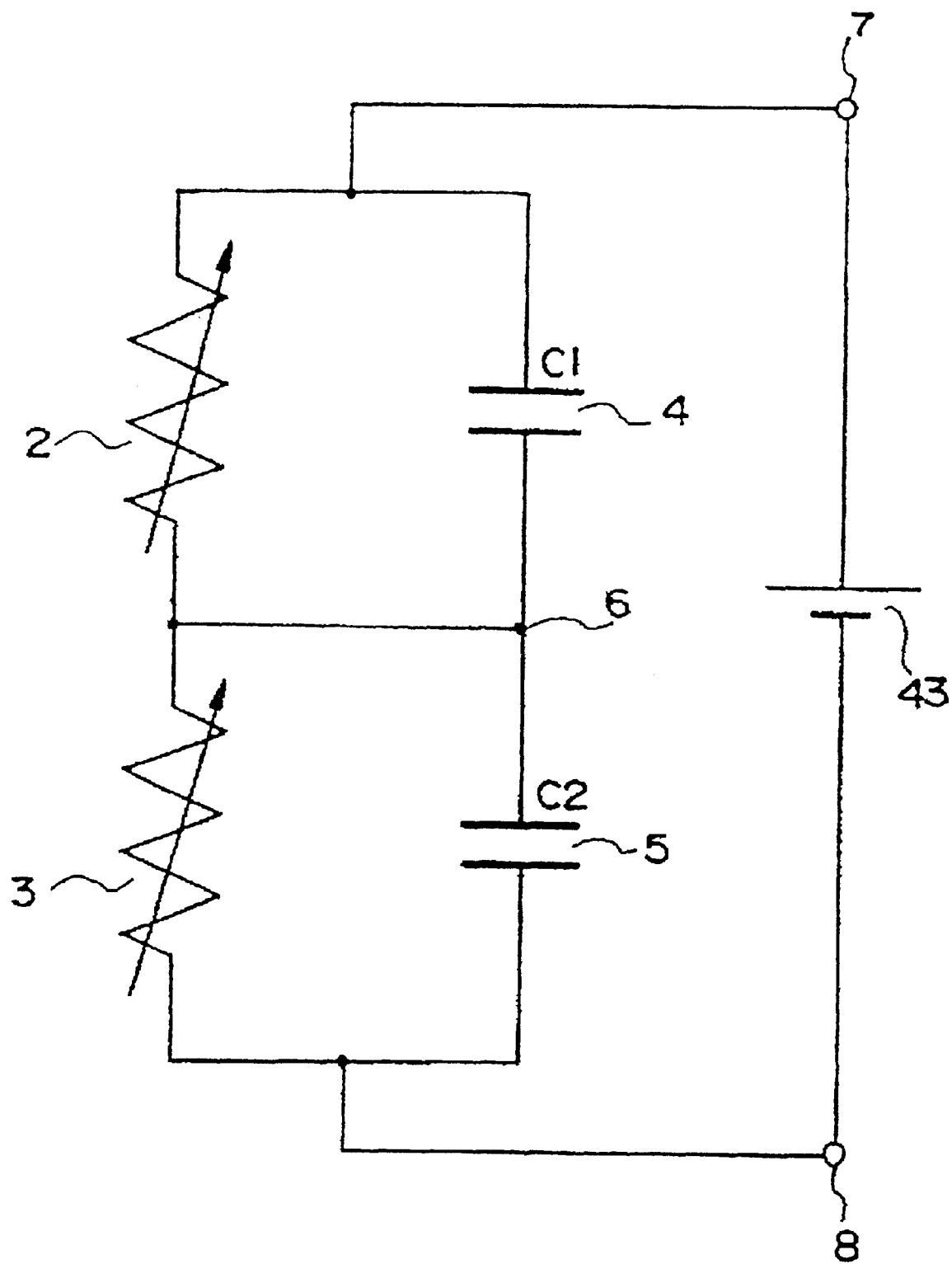
FIG. 8 is a circuit diagram illustrative of the modified model for the semiconductor integrated circuit of FIG. 4, wherein a constant direct current power source is connected between the first and second power terminals.

FIG. 8 is a circuit diagram illustrative of the modified model for the semiconductor integrated circuit of FIG. 4, wherein a constant direct current power source is connected between the first and second power terminals. A constant direct current power source 43 is connected between the first and second power terminals 7 and 8, so that the first and second capacitance values C1 and C2 of the first and second load capacitances 4 and 5 are founded based on the first and second waveforms P1 and P2 of the first and second currents I1 and I2. A first current value flowing through the first load capacitance 4 with the first capacitance value C1 is integrated over time to obtain a first quantity of charge. A second current value flowing through the second load capacitance 5 with the second capacitance value C2 is integrated over time to obtain a second quantity of charge. The first quantity of charge is divided by a first voltage across the first load capacitance 4 to obtain the first capacitance value C1. The second quantity of charge is divided by a second voltage across the second load capacitance 5 to obtain the second capacitance value C2.

The waveform of the current at the power terminals has one cycle T, wherein the first current I1 flows in a first half of the one cycle T, and the second current I2 flows in a second half of the one cycle T.

The second current I2(t) flowing through the first load capacitance 4 is integrated over a time period from T/2 to T to obtain the first charge quantity. The first charge quantity is then divided by a direct current voltage between the first and second power terminals 7 and 8 or by a voltage V of the constant direct current power supply 43, in order to obtain the first capacitance value C1 of the first load capacitance 4. Namely, the first capacitance value C1 of the first load capacitance 4 is obtained in accordance with the following equation.

$$C1 = \int I2(t)dt/V \tag{7}$$

The first current I1(t) flowing through the second load capacitance 5 is integrated over a time period from 0 to T/2 to obtain the second charge quantity. The second charge quantity is then divided by a direct current voltage between the first and second power terminals 7 and 8 or by a voltage V of the constant direct current power supply 43, in order to obtain the second capacitance value C2 of the second load capacitance 5. Namely, the second capacitance value C2 of the second load capacitance 5 is obtained in accordance with the following equation.

$$C2 = \int I1(t)dt/V \tag{8}$$

The time variation of the total current I(t) is given by the voltage value V of the constant direct current power supply 43 and variations in resistance values of the first and second variable resistances 2 and 3. The model shown in FIG. 8 is used, wherein the first and second resistance values R1 and R2 are varied so as to flow the first and second currents I1 and I2 to draw the first and second waveforms P1 and P2 shown in FIG. 7, whereby a model for simulating the electromagnetic interference may easily be prepared.

As described above, the model for the semiconductor integrated circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures. This allows the maker to present the model to the user.

Second Embodiment

A second embodiment according to the present invention will be described in detail with reference to the drawings.

Figure 9:
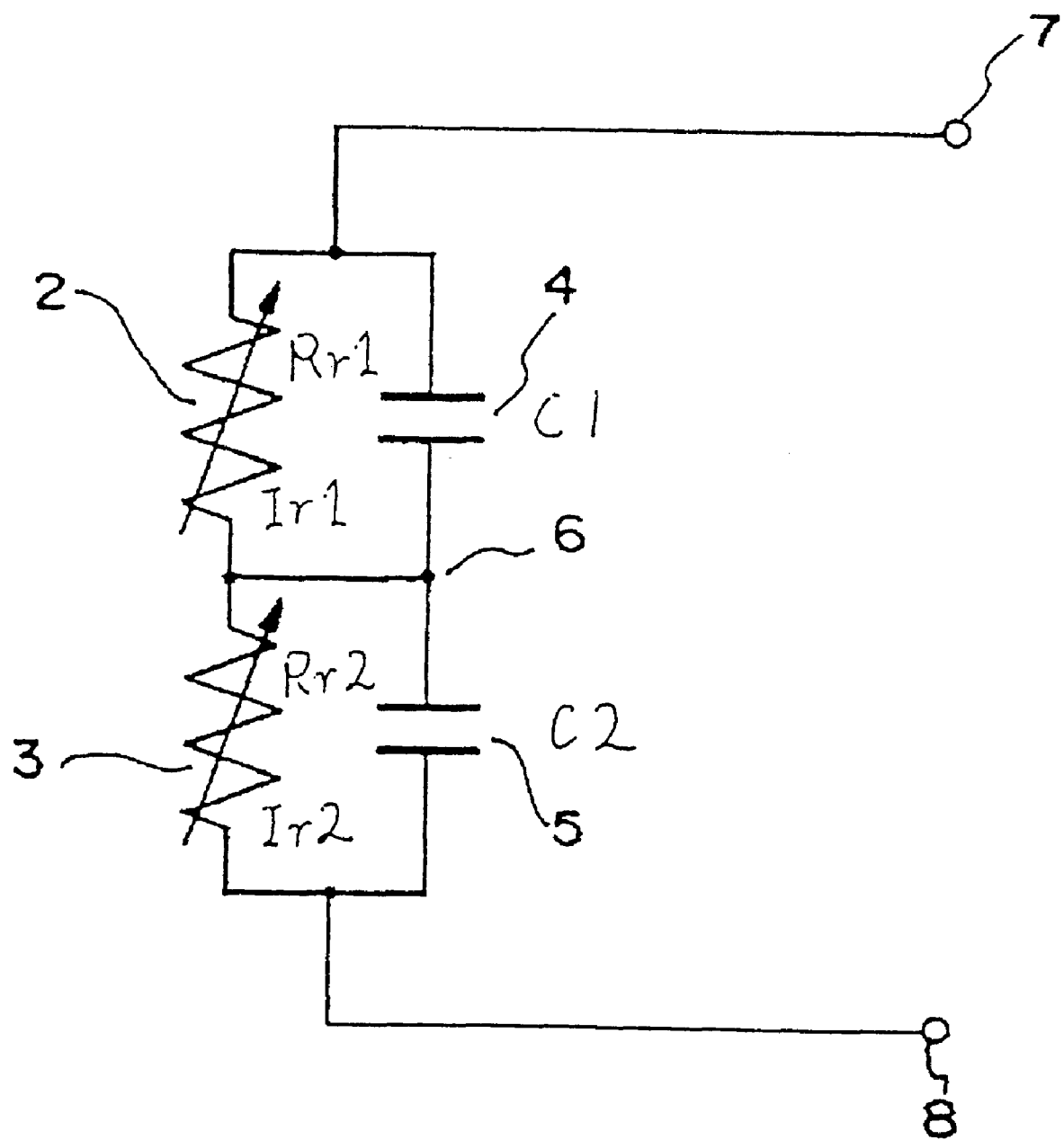
FIG. 9 is a circuit diagram illustrative of a first novel model for the semiconductor integrated circuit at the power terminal for simulating the electromagnetic interference in a second embodiment according to the present invention.

FIG. 9 is a circuit diagram illustrative of a first novel model for the semiconductor integrated circuit at the power terminal for simulating the electromagnetic interference in a second embodiment according to the present invention.

The first novel model includes a first power terminal 7, a second power terminal 8, a first series connection of a first variable resistance 2 and a second variable resistance 3 between the first and second power terminals 7 and 8, a second series connection of a first load capacitor 4 and a second load capacitor 5 between the first and second power terminals 7 and 8, and an internal output terminal 6. The first and second series connections are parallel to each other between the first and second power terminals 7 and 8.

The internal output terminal 6 is connected to an intermediate node between the first and second variable resistances 2 and 3, and also connected to another intermediate node between the first and second load capacitors 4 and 5. The first variable resistance 2 is connected in series between the internal output terminal 6 and the first power terminal 7. The second variable resistance 3 is connected in series between the internal output terminal 6 and the second power terminal 8. The first load capacitor 4 is connected in series between the internal output terminal 6 and the first power terminal 7. The second load capacitor 5 is connected in series between the internal output terminal 6 and the second power terminal 8.

Variations in resistances of the first and second variable resistances 2 and 3 result in variations of a first current at the first power terminal 7 and a second current at the second power terminal 8. The variation of the first current at the first power terminal 7 is used to estimate a first electromagnetic interference from the first power terminal 7. The variation of the second current at the second power terminal 8 is used to estimate a second electromagnetic interference from the second power terminal 8.

Figure 10:
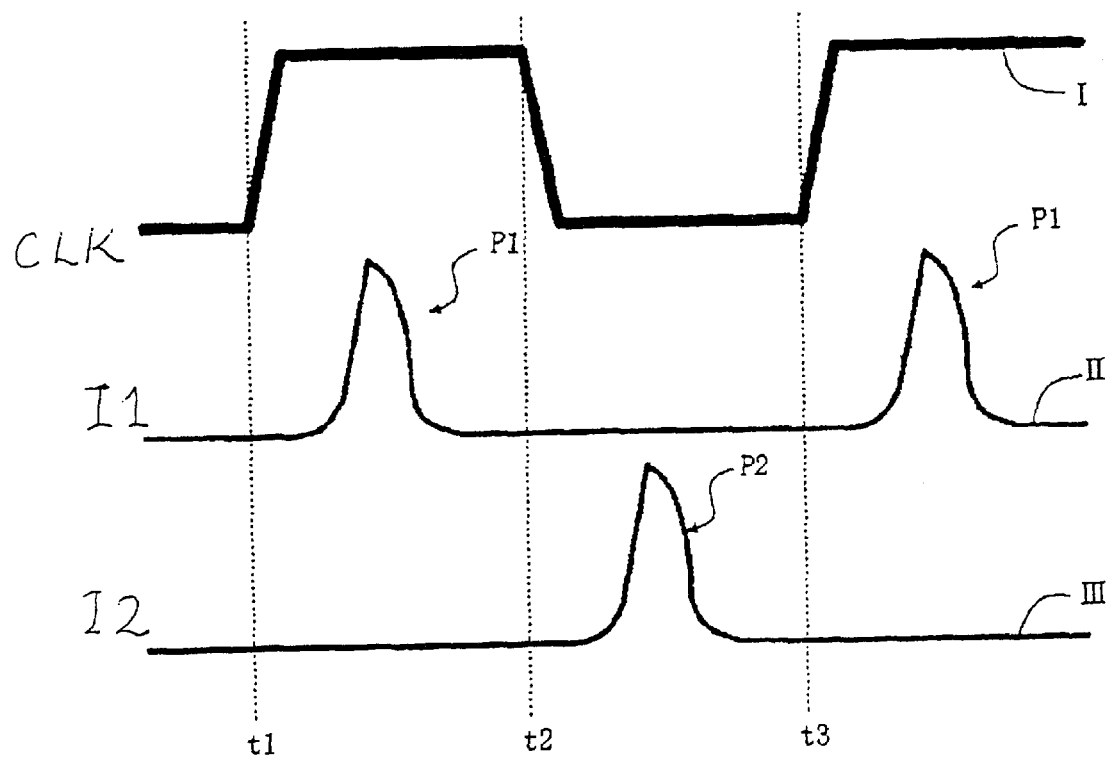
FIG. 10 is a timing chart of first and second waveforms of first and second currents flowing first and second power terminals of the model of FIG. 9.

FIG. 10 is a timing chart of first and second waveforms of first and second currents flowing first and second power terminals of the model of FIG. 9. A first current I1 is a current from the first power terminal 7 through the first variable resistance 2 and the second load capacitance 5 to the second power terminal 8. A second current I2 is a current from the first power terminal 7 through the first load capacitance 4 and the second variable resistance 3 to the second power terminal 8. The first current I1 has a first peak P1. The second current I2 has a second peak P2. A clock signal CLK has the same cycle as the current I. The first current I1 has the first peak P1 in a time period of t1 to t2, where the clock signal CLK is high level. The second current I2 has the second peak P2 in a subsequent time period of t2 to t3, where the clock signal CLK is low level.

Namely, the current timings of the first and second currents I1 and I2 are synchronized with the cycle of the clock signal CLK, The first variable resistance 2 varies the first resistance value Rr1, so that the first resistance value Rrn has the first current Ir1 which has the first peak current waveform P1 caused with a time delay from rising the clock signal CLK at a time t1. The second variable resistance 3 varies the second resistance value Rr2, so that the second resistance value Rr2 has the second current Ir2 which has the second peak current waveform P2 is caused with a time delay from falling the clock signal CLK at a time t2.

The first and second currents Ir1(t) and Ir2(t) flow through the first and second variable resistances 2 and 3 respectively. The first and second currents Ir1(t) and Ir2(t) are obtained from the following simultaneous equations.

$$Ir1(t)=I1(t)\times(C1+C2)/C2 \quad (1)$$

$$Ir2(t)=I2(t)\times(C1+C2)/C1 \quad (2)$$

where I1(t) is the first current, I2(t) is the second current, C1 is the first capacitance value of the first load capacitor 4, and C2 is the second capacitance value of the second load capacitor 5.

The first and second resistances Rr1(t) and Rr2(t) of the first and second variable resistances 2 and 3 are obtained from the following simultaneous equations.

$$Rr1(t)=V1(t)/Ir1(t) \quad (3)$$

$$Rr2(t)=V2(t)/Ir2(t) \quad (4)$$

where V1 is a voltage across the first variable resistance and V2 is a voltage across the second variable resistance.

The first resistance value Rr1(t) of the first variable resistance 2 varies, thereby causing the first current I1(t) from the first power terminal 7 to the second power terminal 8, wherein the first current I1(t) has the first peak current waveform P1. The second resistance value Rr2(t) of the second variable resistance 3 varies, thereby causing the second current I2(t) from the first power terminal 7 to the second power terminal 8, wherein the second current I2(t) has the second peak current waveform P2.

Figure 11:
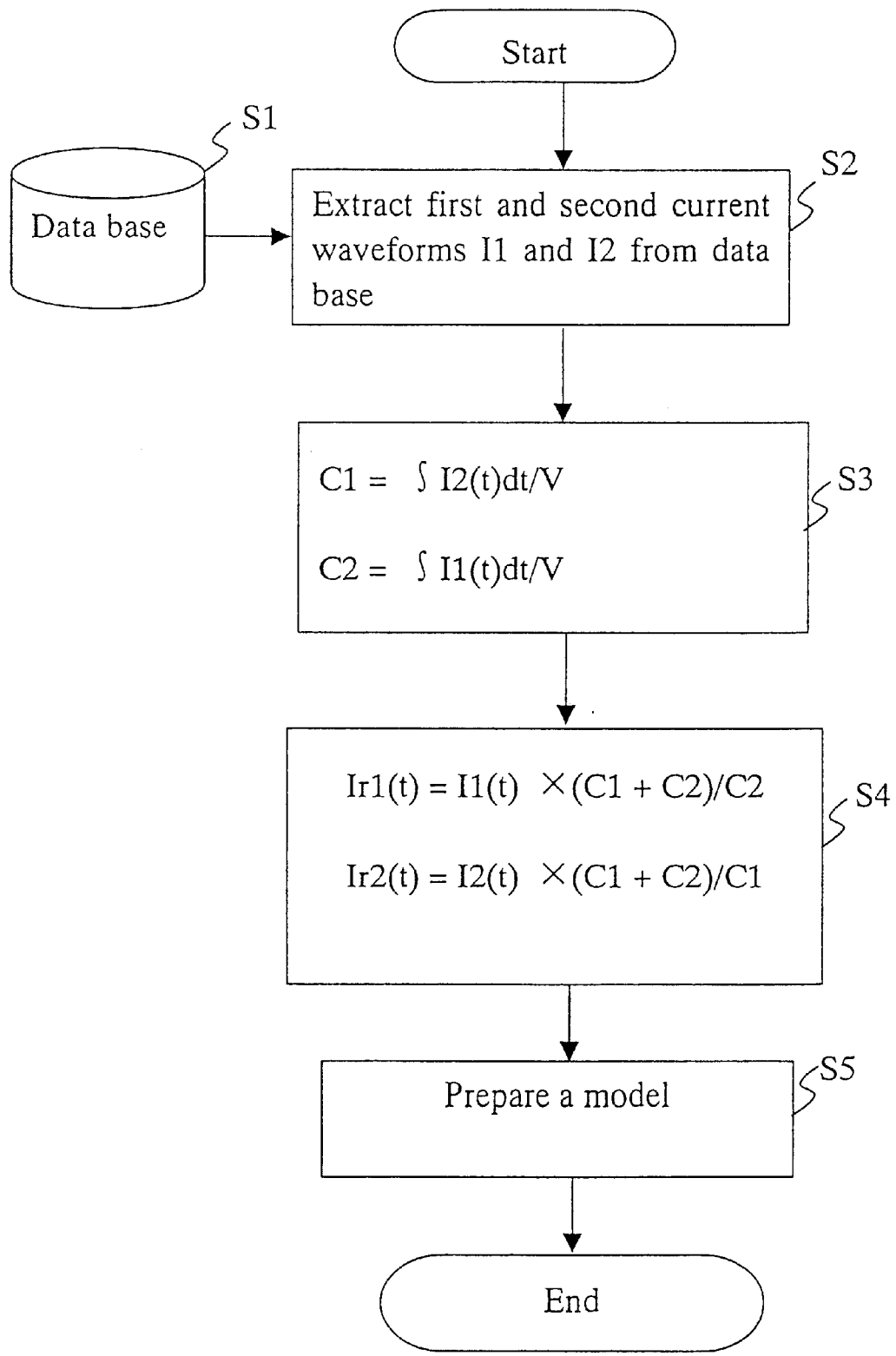
FIG. 11 is a flow chart illustrative of one example of available methods of preparing the model of FIG. 9.

FIG. 11 is a flow chart illustrative of one example of available methods of preparing the model of FIG. 9.

In a step S1, one cycle waveform is extracted from data of current waveforms I(t) of the semiconductor integrated circuit.

In a step S2, the one cycle waveform is divided into first and second half cycle waveforms, wherein the first half cycle waveform corresponds to the first current I1(t) and the second half cycle waveform corresponds to the second current I2(t).

In a step S3, the first and second capacitances C1 and C2 of the first and second load capacitances 4 and 5 are calculated based on the above equations (7) and (8).

In a step S4, the first and second waveforms Ir1(t) and Ir2(t) are calculated based on the above equations (1) and (2).

In a step S5, parameters obtained in the steps S3 and S4 are inserted into a model temperate to form a model of FIG. 9, wherein the model temperate includes the definitions of the above equations (3) and (4) and the informations of the operations shown in the timing chart of FIG. 10.

As described above, the model for the semiconductor integrated circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures. This allows the maker to present the model to the user.

Third Embodiment

Figure 12:
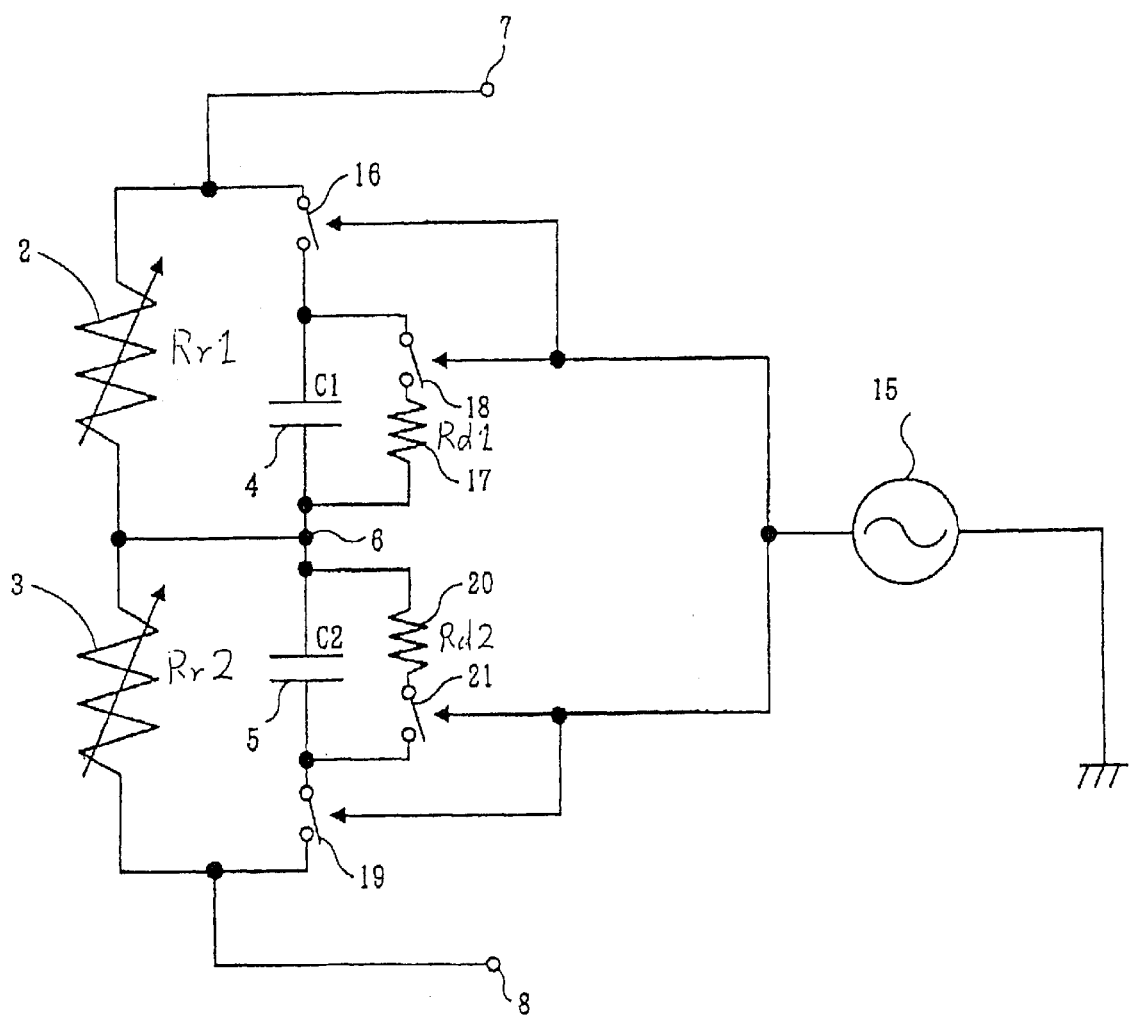
FIG. 12 is a circuit diagram illustrative of a second novel model for the semiconductor integrated circuit at the power terminal for simulating the electromagnetic interference in a third embodiment according to the present invention.

A third embodiment according to the present invention will be described in detail with reference to the drawings. FIG. 12 is a circuit diagram illustrative of a second novel model for the semiconductor integrated circuit at the power terminal for simulating the electromagnetic interference in a third embodiment according to the present invention.

The first novel model includes a first power terminal 7, a second power terminal 8, a first series connection of a first variable resistance 2, and a second variable resistance 3 between the first and second power terminals 7 and 8, a second series connection of a first load capacitor 4, a second load capacitor 5, a first switch 16 and a second switch 19 between the first and second power terminals 7 and 8, and an internal output terminal 6. The first and second series connections are parallel to each other between the first and second power terminals 7 and 8.

The first load capacitor 4 has a first bypass which includes a series connection of third switch 18 and a first constant resistance 17. The second load capacitor 5 has a second bypass which includes a series connection of fourth switch 21 and a second constant resistance 20. The first and second constant resistances 18 and 20 have first and second constant resistance values Rd1 and Rd2 which may optionally be decided by users. For example, Rd1=Rd2=1 ohm.

A control power 15 is further provided for generating a control signal which controls ON-OFF operations of the first to fourth switches 16, 19, 18 and 21. The output of the control power 15 is electrically coupled to the first to) fourth switches 16, 19, 18 and 21, so that the control signal controls ON-OFF operations of the first to fourth switches 16, 19, 18 and 21, whereby the first and second variable resistance values Rr1 and Rr2 of the first and second variable resistances 2 and 3 are controlled. The control signal is a pulse signal which is synchronized with the clock cycle of the semiconductor integrated circuit, for controlling the currents at the power terminals.

The internal output terminal 6 is connected to an intermediate node between the first and second variable resistances 2 and 3, and also connected to another intermediate node between the first and second load capacitors 4 and 5. The first variable resistance 2 is connected in series between the internal output terminal 6 and the first power terminal 7. The second variable resistance 3 is connected in series between the internal output terminal 6 and the second power terminal 8. The first load capacitor 4 is connected in series between the internal output terminal 6 and the first power terminal 7. The second load capacitor 5 is connected in series between the internal output terminal 6 and the second power terminal 8.

Variations in resistances of the first and second variable resistances 2 and 3 result in variations of a first current at the first power terminal 7 and a second current at the second power terminal 8. The variation of the first current at the first power terminal 7 is used to estimate a first electromagnetic interference from the first power terminal 7. The variation of the second current at the second power terminal 8 is used to estimate a second electromagnetic interference from the second power terminal 8.

Figure 13:
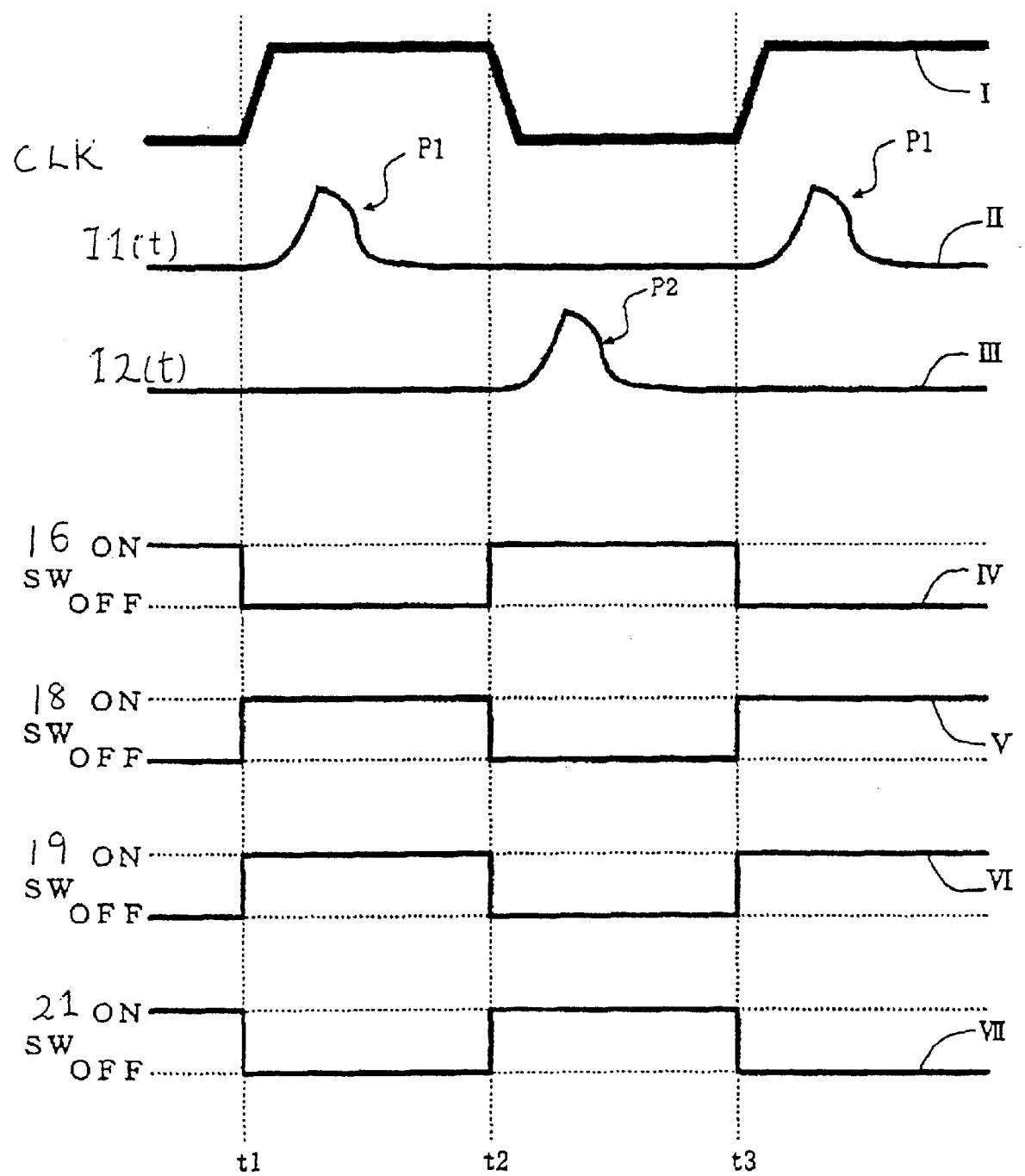
FIG. 13 is a timing chart of first and second waveforms of first and second currents flowing first and second power terminals, as well as ON-OFF operations of the first to fourth switches of the model of FIG. 12.

FIG. 13 is a timing chart of first and second waveforms of first and second currents flowing first and second power terminals, as well as ON-OFF operations of the first to fourth switches of the model of FIG. 12, A first current I1 is a current from the first power terminal 7 through the first variable resistance 2 and the second load capacitance 5 to the second power terminal 8. A second current I2 is a current from the first power terminal 7 through the first load capacitance 4 and the second variable resistance 3 to the second power terminal 8. The first current I1 has a first peak P1. The second current I2 has a second peak P2. A clock signal CLK has the same cycle as the current I. The first current I1 has the first peak P1 in a time period of t1 to t2, where the clock signal CLK is high level, and the first and fourth switches 16 and 21 are in the OFF-state, and the second and third switches 19 and 18 are in the ON-state. The second current I2 has the second peak P2 in a subsequent time period of t2 to t3, where the clock signal CLK is low level, and the first and fourth switches 16 and 21 are in the ON-state, and the second and third switches 19 and 18 are in the OFF-state.

Namely, the current timings of the first and second currents I1 and I2 are synchronized with the cycle of the clock signal CLK. The first variable resistance 2 varies the first resistance value Rrn, so that the first resistance value tr1 has the first current Ir1 which has the first peak current waveform P1 caused with a time delay from rising the clock signal CLK at a time t1. The second variable resistance 3 varies the second resistance value Rr2, so that the second resistance value Rr2 has the second current Ir2 which has the second peak current waveform P2 is caused with a time delay from falling the clock signal CLK at a time t2.

The first and second variable resistance values Rr1(t) and Rr2(t) of the first and second variable resistances 2 and 3 are given by the following equations (5) and (6).

$$Rr1(t)=V1(t)/I1(t) \quad (5)$$

$$Rr2(t)=V2(t)/I2(t) \quad (6)$$

where V1 is the voltage across the first variable resistance 2, and V2 is the voltage across the second variable resistance 3, and I1(t) is the first current and I2(t) is the second current.

The first resistance value Rr1(t) of the first variable resistance 2 varies, thereby causing the first current I1(t) from the first power terminal 7 to the second power terminal 8, wherein the first current I1(t) has the first peak current waveform P1. The second resistance value Rr2(t) of the second variable resistance 3 varies, thereby causing the second current I2(t) a from the first power terminal 7 to the second power terminal 8, wherein the second current I2(t) has the second peak current waveform P2.

Figure 14:
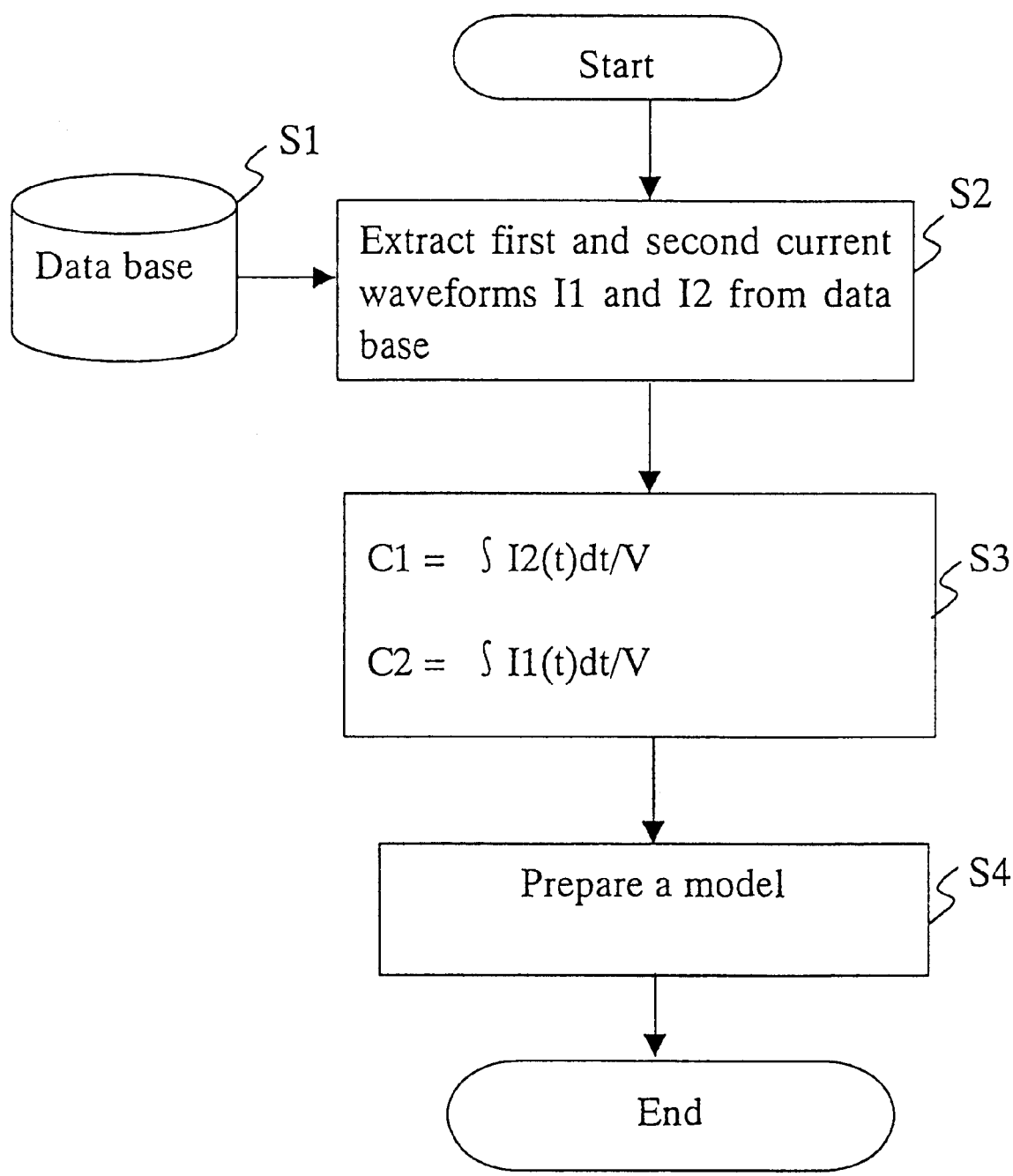
FIG. 14 is a flow chart illustrative of one example of available methods of preparing the model of FIG. 12.

FIG. 14 is a flow chart illustrative of one example of available methods of preparing the model of FIG. 12.

In a step S1, one cycle waveform is extracted from data of current waveforms I(t) of the semiconductor integrated circuit.

In a step S2, the one cycle waveform is divided into first and second half cycle waveforms, wherein the first half cycle waveform corresponds to the first current I1(t) and the second half cycle waveform corresponds to the second current I2(t).

In a step S3, the first and second capacitances C1 and C2 of the first and second load capacitances 4 and 5 are calculated based on the above equations (7) and (8).

In a step S4, parameters obtained in the steps S2 and S3 are inserted into a model temperate to form a model of FIG. 12, wherein the model temperate includes the definitions of the above equations (5) and (6) and the informations of the operations shown in the timing chart of FIG. 13.

As described above, the model for the semiconductor integrated circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is tree of any confidential informations for circuit configurations and device structures. This allows the maker to present the model to the user.

Fourth Embodiment

Figure 15:
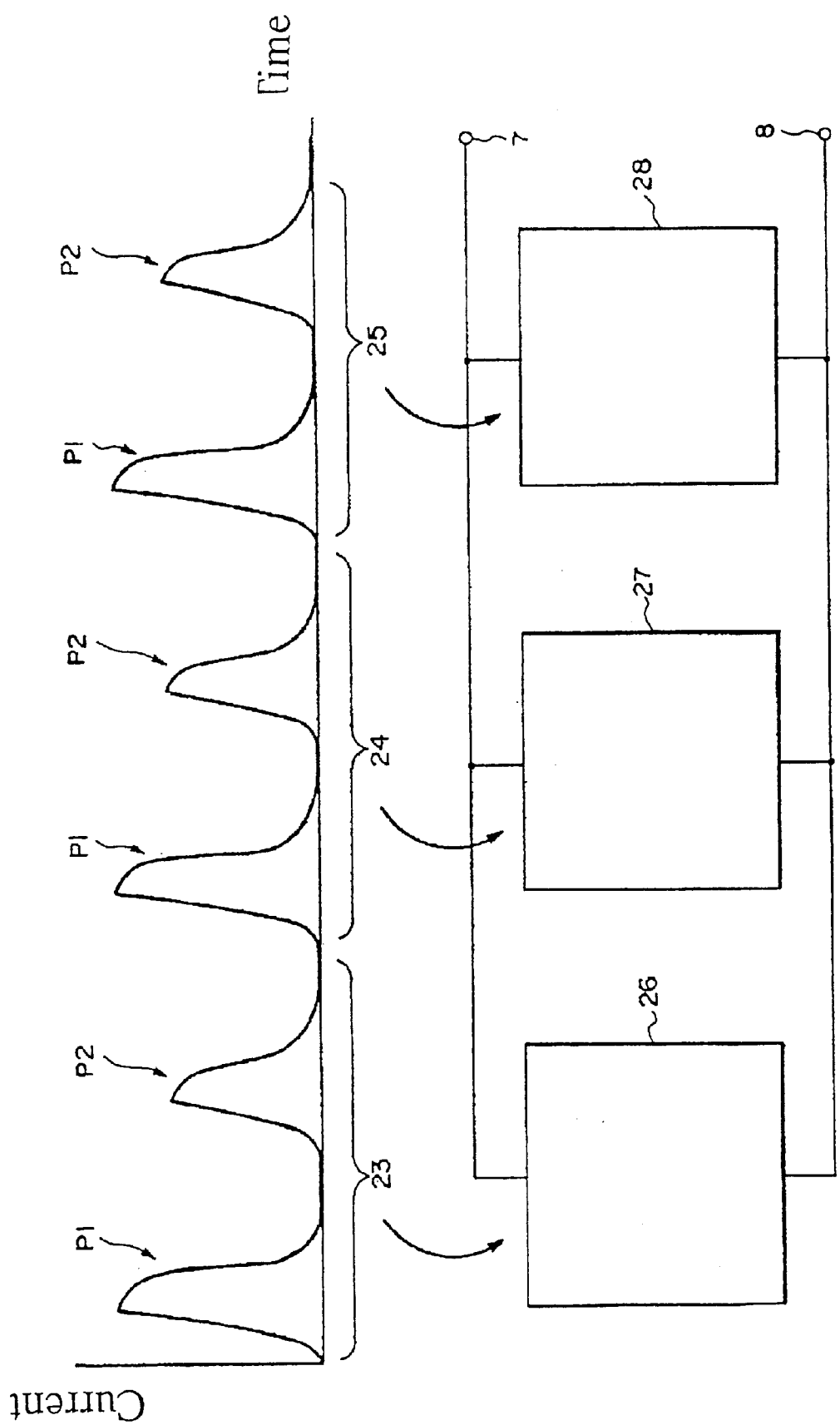
FIG. 15 is a diagram illustrative of first and second current waveforms of first and second currents from a first power terminal to a second power terminal of a model and three models connected between first and second power terminals in a fourth embodiment in accordance with the present invention.

A fourth embodiment according to the present invention will be described in detail with reference to the drawings. FIG. 15 is a diagram illustrative of first and second current waveforms of first and second currents from a first power terminal to a second power terminal of a model and three models connected between first and second power terminals. Three sets of the first and second current waveforms P1 and P2 of the first and second currents I1(t) and I2(t) are present in one cycle. In one cycle, the first and second peak waveforms P1 and P2 alternately appear tree times respectively, First, second and third models 26, 27 and 28 are connected between a first power terminal 7 and a second power terminal 8. The first, second and third models 26, 27 and 28 are parallel to each other between the first and second power terminals 7 and 8.

A first pair 23 of a first-appearance first peak waveform P1 and a first-appearance second peak waveform P2 appears before a second pair 24 of a second-appearance first peak waveform P1 and a second-appearance second peak waveform P2. The second pair 24 appears before a third pair 24 of a third-appearance first peak waveform P1 and a third-appearance second peak waveform P2.

Each of the first, second and third models 26, 27 and 28 may comprise either one of the foregoing novel models. The first model 26 is prepared based on the first pair 23 of the first-appearance first peak waveform P1 and the first-appearance second peak waveform P2. The second model 27 is prepared based on the second pair 24 of the second-appearance first peak waveform P1 and the second-appearance second peak waveform P2. The third model 28 is prepared based on the third pair 24 of the third-appearance first peak waveform P1 and the third-appearance second peak waveform P2.

The above described novel methods for preparing the models may be available, wherein the first variable resistance value Rr1 of the first variable resistance 2 and the second capacitance value C2 of the second load capacitance 5 are obtained based on the first current I1(t) having the first peak waveform P1, and wherein the second variable resistance value Rr2 of the second variable resistance 3 and the first capacitance value C1 of the first load capacitance 4 are obtained based on the second current I2(t) having the second peak waveform P2.

In this examples, three sets of the first and second peak waveforms P1 and P2 and the three models 26, 27 and 28 are used. Notwithstanding, the number of the models and, the number of the sets of the first and second peak waveforms P1 and P2 may change, provided that the number of the models is the same as the number of the sets of the first and second peak waveforms P1 and P2.

As described above, the model for the semiconductor integrated circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures. This allows the maker to present the model to the user.

Fifth Embodiment

Figure 16:
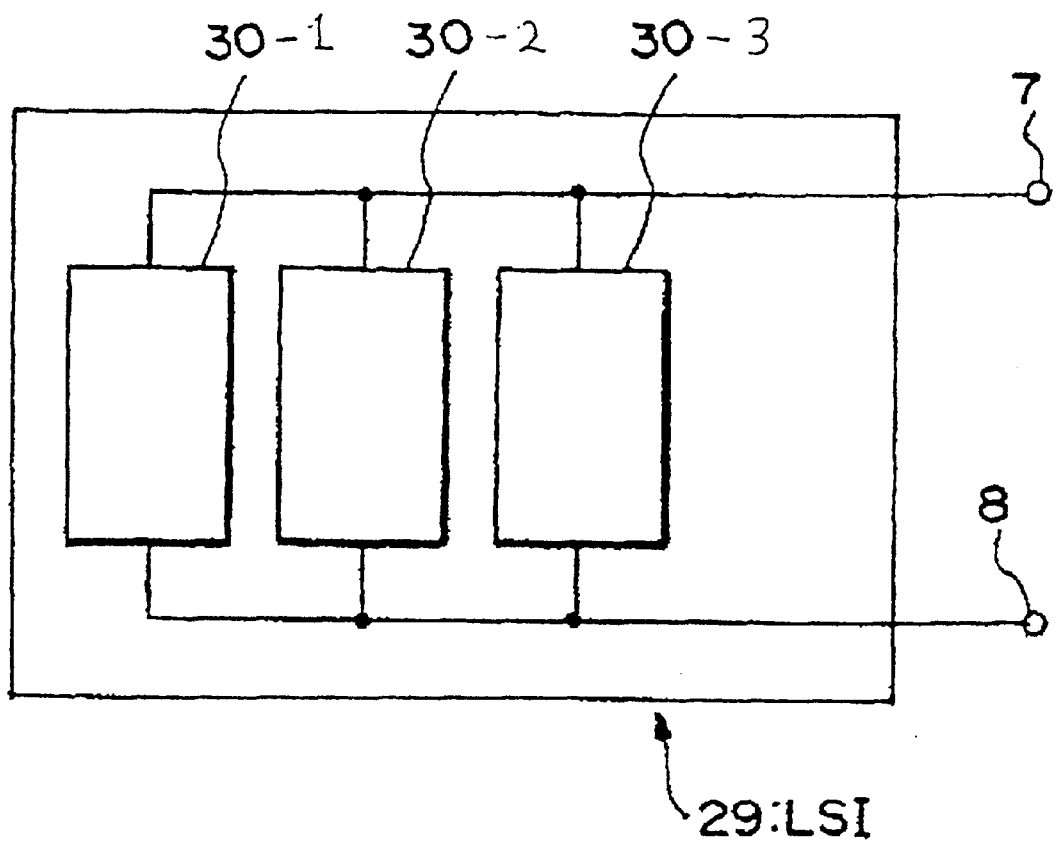
FIG. 16 is a circuit diagram illustrative of a fourth novel model for the semiconductor integrated circuit at the power terminal for simulating the electromagnetic interference in a fifth embodiment according to the present invention.

A fifth embodiment according to the present invention will be described in detail with reference to the drawings. FIG. 16 is a circuit diagram illustrative of a fourth novel model for the semiconductor integrated circuit at the power terminal for simulating the electromagnetic interference in a fifth embodiment according to the present invention. A semiconductor integrated circuit 29 is divided into a plurality of sub-blocks 30-1, 30-2, and 30-3 which are connected between first and second power terminals 7 and 8, wherein the sub-blocks 30-1, 30-2, and 30-3 are parallel to each other. For each of the divided sub-blocks 30-1, 30-2, and 30-3, a model is prepared in accordance with either one of the novel methods of the first to fourth embodiments of the present invention. The number of the divided sub-blocks is not limited. Even if all of the circuit informations for the semiconductor integrated circuit are huge, then it is effective that the semiconductor integrated circuit may be divided into the plural sub-blocks, so that respective currents at the power terminals are obtained for each of the sub-blocks for subsequent simple operation of summing the respective currents to obtain a total current at the power terminals of the model.

As described above, the model for the semiconductor integrated circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures This allows the maker to present the model to the user.

Sixth Embodiment

Figure 17:
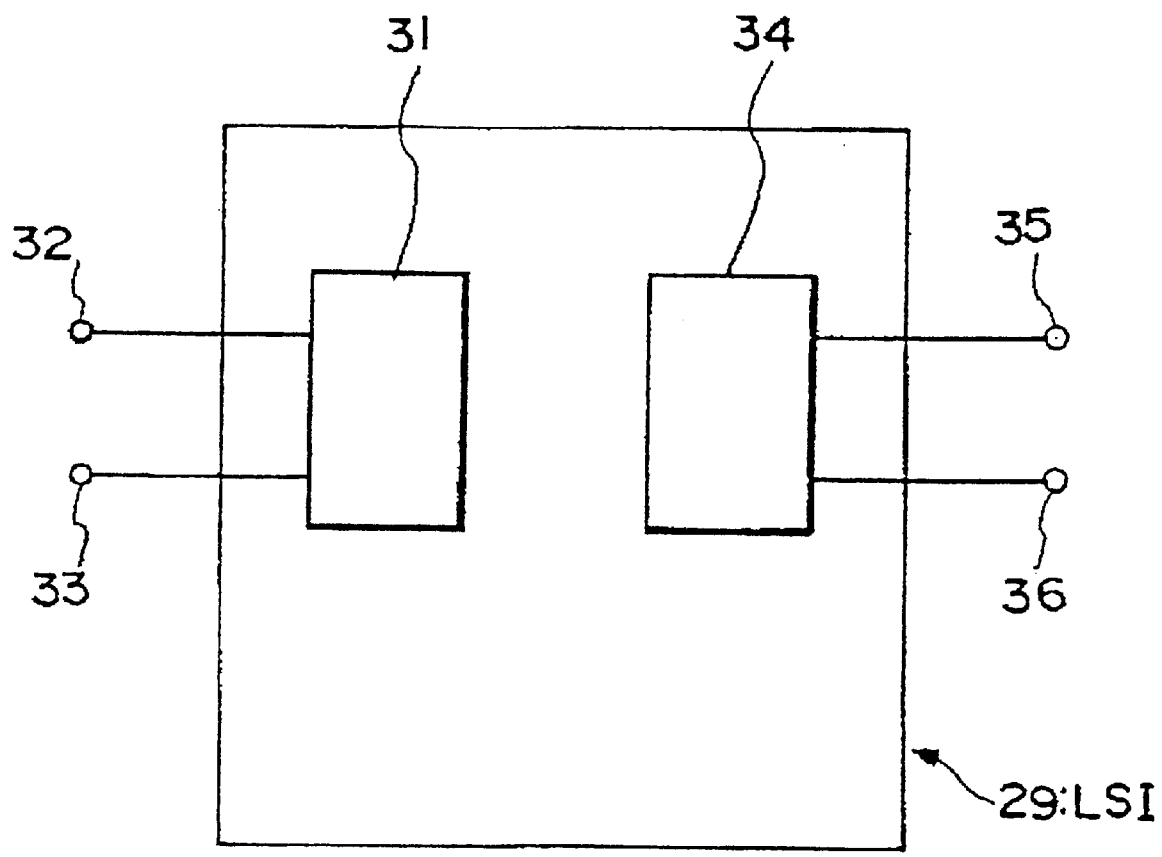
FIG. 17 is a circuit diagram illustrative of a fifth novel model for the semiconductor integrated circuit at the power terminal for simulating the electromagnetic interference in a sixth embodiment according to the present invention.

A sixth embodiment according to the present invention will be described in detail with reference to the drawings. FIG. 17 is a circuit diagram illustrative of a fifth novel model for the semiconductor integrated circuit at the power terminal for simulating the electromagnetic interference in a sixth embodiment according to the present invention. A semiconductor integrated circuit 29 has plural power systems, for example, a first power system including first and second power terminals 32 and 33 and a second power system including third and fourth power terminals 35 and 36. The semiconductor integrated circuit 29 is divided into two sub-blocks 31 and 34. The first sub-block 31 is connected between the first and second power terminals 32 and 33. The second sub-block 34 is connected between the third and fourth power terminals 35 and 36.

A first model for the first sub-block 31 is prepared in accordance with either one of the first to fifth novel methods in the first to fifth embodiments in accordance with the present invention. A second model for the first sub-block 34 is prepared in accordance with either one of the first to fifth novel methods in the first to fifth embodiments in accordance with the present invention.

Namely, either one of the first to fifth novel methods in the first to fifth embodiments in accordance with the present invention may be applied to the semiconductor integrated circuit having plural power systems.

As described above, the model for the semiconductor integrated circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures. This allows the maker to present the model to the user.

Seventh Embodiment

Figure 18:
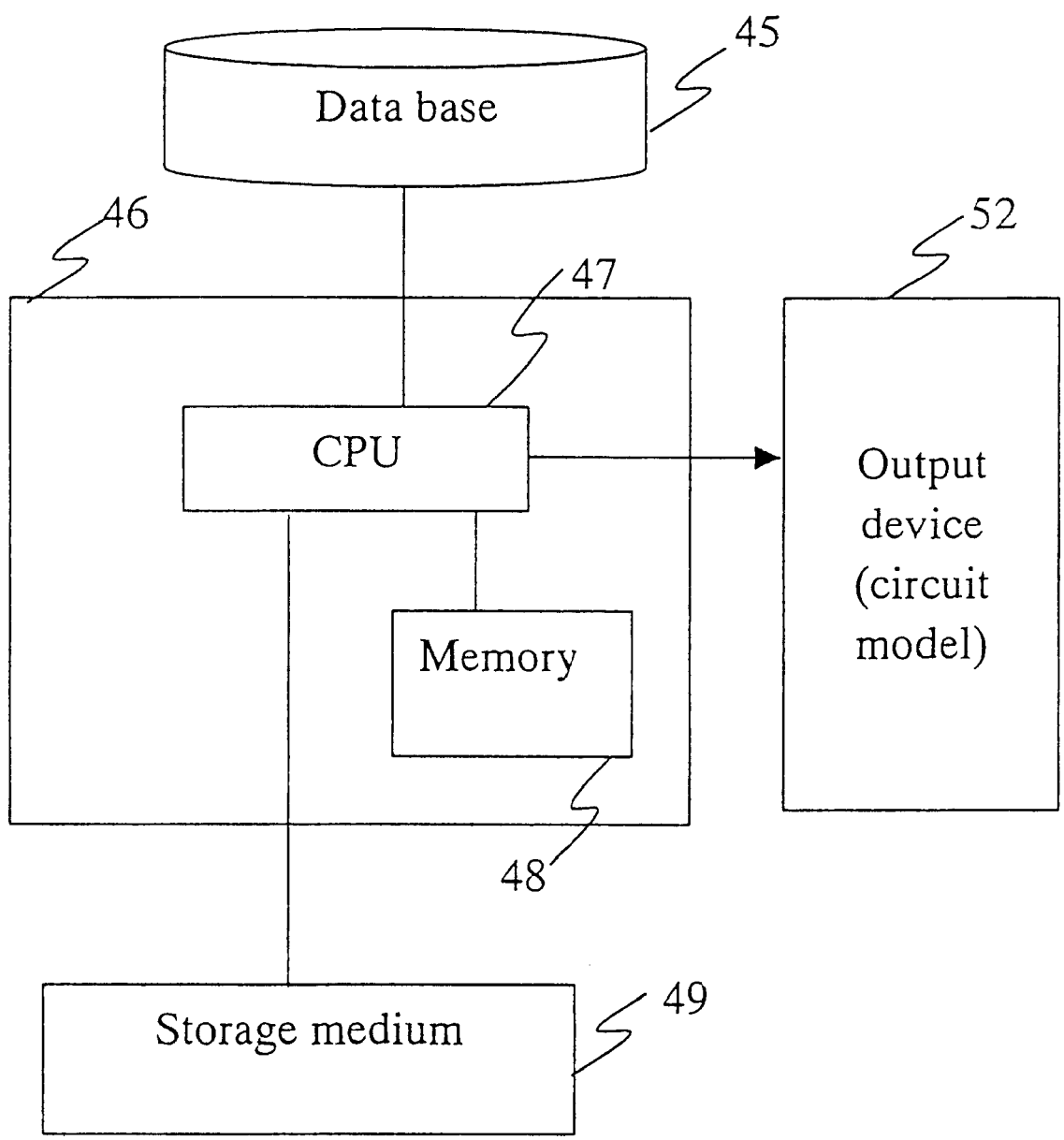
FIG. 18 is a system for executing a novel method for preparing a model for a semiconductor integrated circuit at power terminal for simulating electromagnetic interference.

A seventh embodiment according to the present invention will be described in detail with reference to the drawings. FIG. 18 is a system for executing a novel method for preparing a model for a semiconductor integrated circuit at power terminal for stimulating electromagnetic interference. The system includes a data base 45 for storing data, a processor 46 connected to the data base 45 for fetching necessary data, an output device 52 connected to the processor 46 for outputting the model, a storage medium 49 for storing the necessary informations for executing the novel method for preparing the model. The processor 46 further includes a central processing unit 47 connected to the data base 45, the storage medium 49 and the output device 52, and a memory device 48 connected to the central processing unit 47.

The data base 45 stores current value tables which indicate current values at power terminals for respective times which represents current waveforms at power terminals of the semiconductor integrated circuits. Namely, the data base 45 stores current waveform informations over times. The data base 45 also stores constant voltage values V of the constant direct current power supply 43 when the current waveform is obtained.

The storage medium 49 stores model templates shown in FIGS. 9 and 12 and also stores a computer-readable program for executing the novel method for preparing the model for the semiconductor integrated circuit as shown in FIGS. 11 and 14. The storage medium 49 may be any one of available information storage mediums such as a magnetic disk, a semiconductor memory, and a CD-ROM. The CPU 47 reads out the program from the storage medium 49, so that the processor 46 operates in accordance with the program.

Operations of the system of FIG. 18 for executing the processes shown in FIG. 11 will be described. The CPU 47 extracts, from the data base 45, current value tables over times which represent the first and second current waveforms I1(t) and I2(t), and the CPU 47 makes the memory device 48 store the current value tables. The memory device 48 also stores voltage value V.

The CPU 47 sequentially reads out the waveform informations and the voltage values V from the memory device 48 for calculating C1, C2, Ir1(t), and Ir2(t), respectively. The CPU 47 makes the memory device 48 store the C1 and C2 in the form of value and also the Ir1(t) and Ir2(t) in the form of time-table.

The CPU 47 reads out, from the storage medium 49, the model template which includes all informations associated with the operations of FIG. 10. The CPU 47 inserts the C1, C2, Ir1(t), and Ir2(t) into the model template to prepare a model. This model is output from the output device 52.

Operations of the system of FIG. 18 for executing the processes shown in FIG. 14 will be described. The CPU 47 extracts, from the data base 45, current value tables over times which represent the first and second current waveforms I1(t) and I2(t), and the CPU 47 makes the memory device 48 store the current value tables. The memory device 48 also stores voltage value V.

The CPU 47 sequentially reads out the waveform informations and the voltage values V from the memory device 48 for calculating C1, and C2, respectively. The CPU 47 makes the memory device 48 store the C1 and C2 in the form of value.

The CPU 47 reads out, from the storage medium 49, the model template which includes all informations associated with the operations of FIG. 13. The CPU 47 inserts the C1 and C2, Ir1(t), and Ir2(t) into the model template to prepare a model. This model is output from the output device 52.

Figure 20:
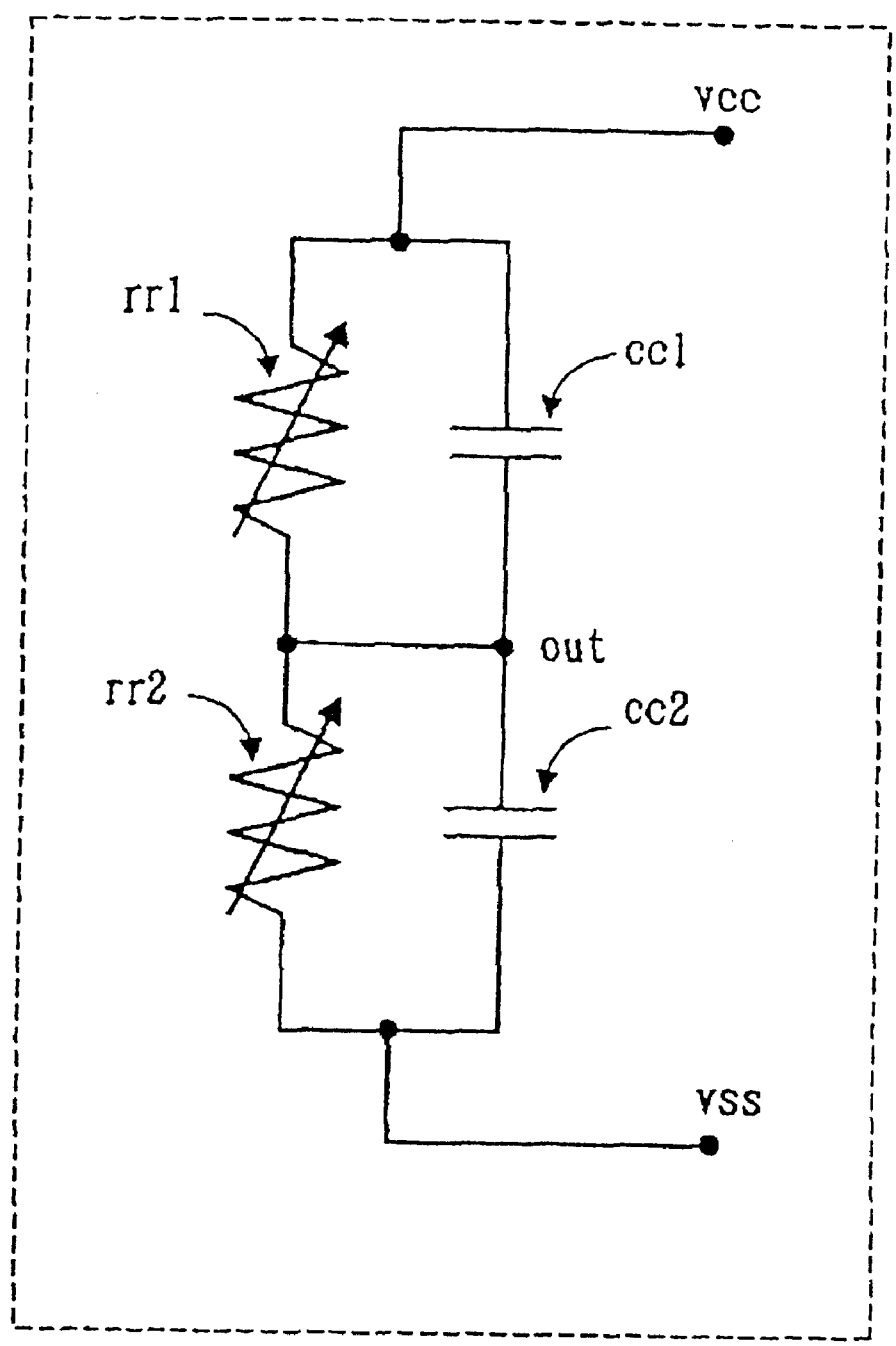
FIG. 20 is a circuit diagram of a model template from the model template described in text-format of FIG. 19.

FIG. 19 is a view of a model template described in text-format which corresponds to the model shown in FIG. 9. The model template described in text-format includes necessary data for analysis connections and circuit elements informations. FIG. 20 is a circuit diagram of a model template from the model template described in text-format of FIG. 19, wherein relationships of nodes and elements are shown. Underlined broad characters are decided by an input data base.

Respective elements of the model template will be described. "rr1" represents the first variable resistance 2. "vcc out" represents that "rr1" is connected between nodes "vcc" and "out". The description "r1(t)=(v(vcc)(t)−v(out)(t))/ir1(t)" represents the definition of the equation (3). "v(node-name)(t)" represents a potential of this node at a time "t". "v(vcc)(t)−v(out)(t)" represents "V1" in the equation (3). "ir1" is a table information which corresponds to "Ir1(t)" in the equation (1). "rr1" calculated sequentially with reference to the table information at a time "t" becomes "r1(t)".

Respective elements of the model template will be described. "rr2" represents the second variable resistance 3. "out vss" represents that "rr2" is connected between nodes "vss" and "out". The description "r2(t)=(v(vss)(t)−v(out)(t))/ir2(t)" represents the definition of the equation (4). "v(node-name)(t)" represents a potential of this node at a time "t". "v(vss)(t)−v(out)(t)" represents "V2" in the equation (4). "ir2" is a table information which corresponds to "Ir2(t)" in the equation (2). "rr2" calculated sequentially with reference to the table information at a time "t" becomes "r2(t)".

Table informations "ir1(t) table( - - - )", "ir2(t) table( - - - )" are described in the text-description. "ir1(t) table( - - - )" is a table information which corresponds to the Ir1(t) obtained by the equation (1). "ir2(t) table( - - - )" is a table information which corresponds to the Ir2(t) obtained by the equation (2).

The descriptions in the bracket of table represents the respective current values at respective times. The increase in the number of row means the time-pass. This table information is not represented on the circuit diagram of FIG. 20.

Plotting the respective current values at respective times may expect non-described current values at non-described times and also may draw a current waveform.

Figure 21:
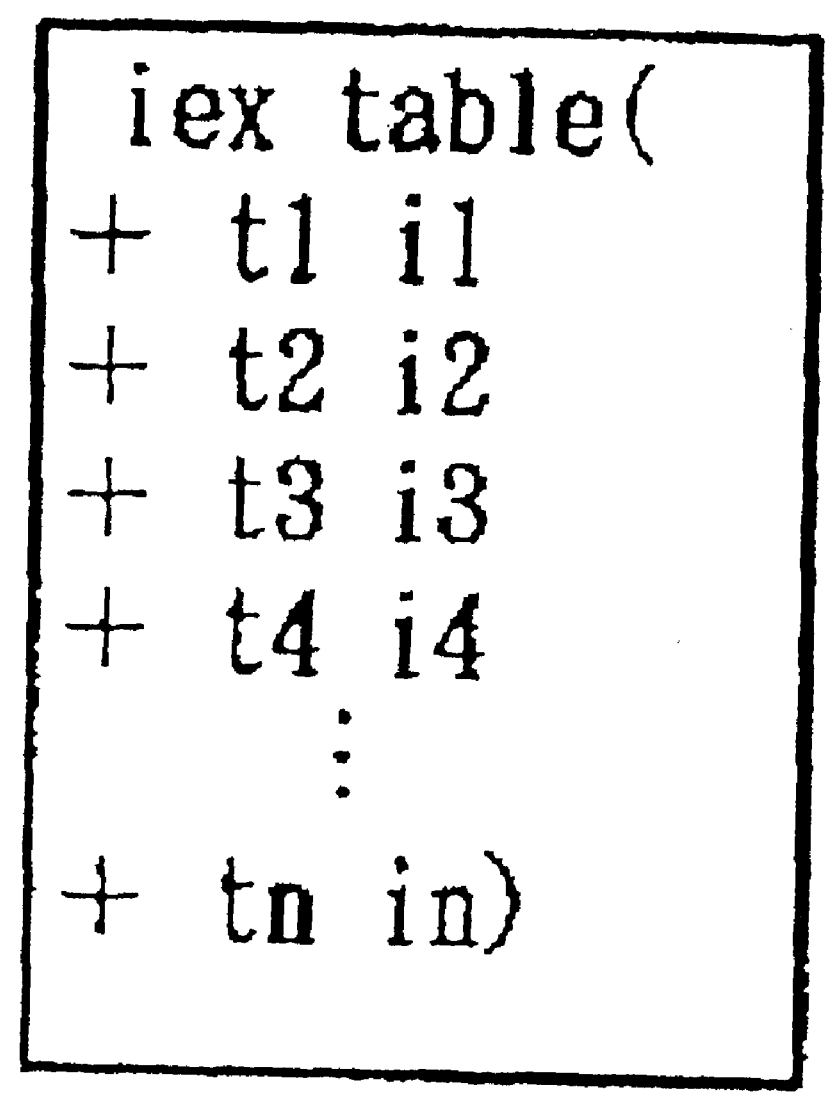
Figure 22:
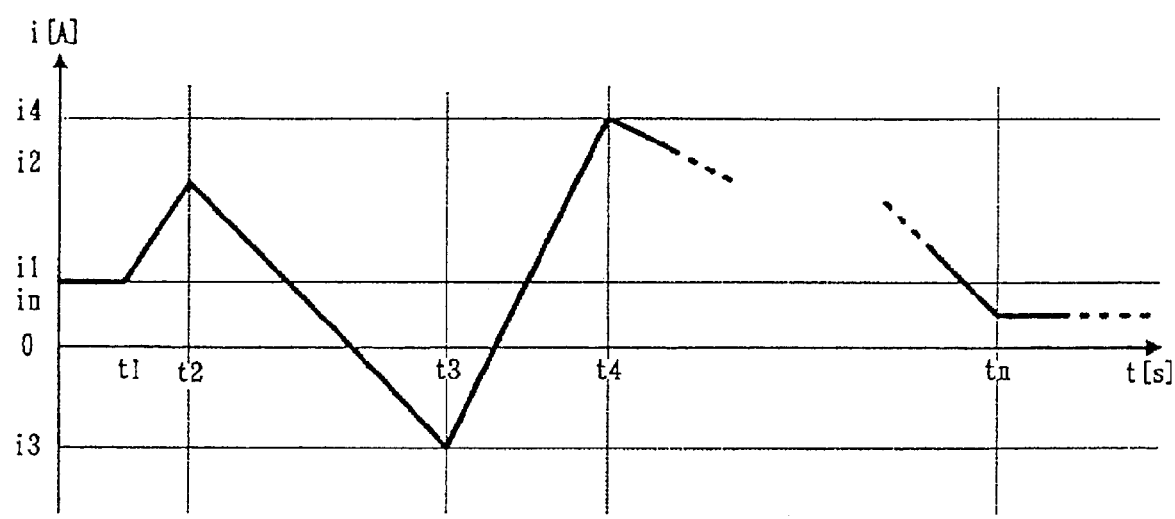
FIG. 22 is a diagram of waveform drawn from the table information of FIG. 21.

FIG. 21 is a view of a table information included in the template shown in FIG. 19. FIG. 22 is a diagram of waveform drawn from the table information of FIG. 21. The table information not only represents current values "i1" "i2", "i3", "i4" - - - "in" at times "t1", "t2", "t3", "t4" - - - "tn" respectively, but also represents that in an initial time period from 0 to t1, the current value is i1, - - - in a final time period from tn to t, the current value is also in. This table information also includes that the current value varies linearly.

In the table information "table( - - - )", only the current described is caused. The final current value after the time "tn" is "in (final current value)". I1(t) and I2(t) are data in the half cycle. Thus, the Ir1(t) and Ir2(t) are data in the half cycle. For this reason, if the table informations for Ir1(t) and Ir2(t) are described in the bracket of table, data are only for one cycle, The table information for Ir1(t) is expanded in data to allow the conditions defined by the following equations (9) and (10). The table information for Ir2(t) is also expanded in data to allow the conditions defined by the following equations (11) and (12).

$$Ir1(t)=0 (T/2 \leq t \leq T) \quad (9)$$

$$Ir1(t+NT)=Ir1(t) \quad (10)$$

$$Ir2(t)=0 (0 \leq t \leq T/2) \quad (11)$$

$$Ir2(t+NT)=Ir2(t) \quad (12)$$

where T is a cycle of the current I, N is the natural number.

The above data expansions allow data analysis until the cycle number M. The cycle number M is the natural number of not less than 2. The cycle number "M" may be decided optionally by the user. The data expansion operation for the equations (9) and (10) is preferably executed before the step S5 of FIG. 11.

"cc1" and "cc2" correspond to the first and second load capacitances 4 and 5 shown in FIG. 9. "vcc out" described in text format in FIG. 19 represents that "cc1" is connected between nodes "vcc" and "out". "out vss" represents that "cc2" is connected between nodes "vss" and "out". "C1" and "C2" are values calculated from the equations (7) and (8).

Figure 23:
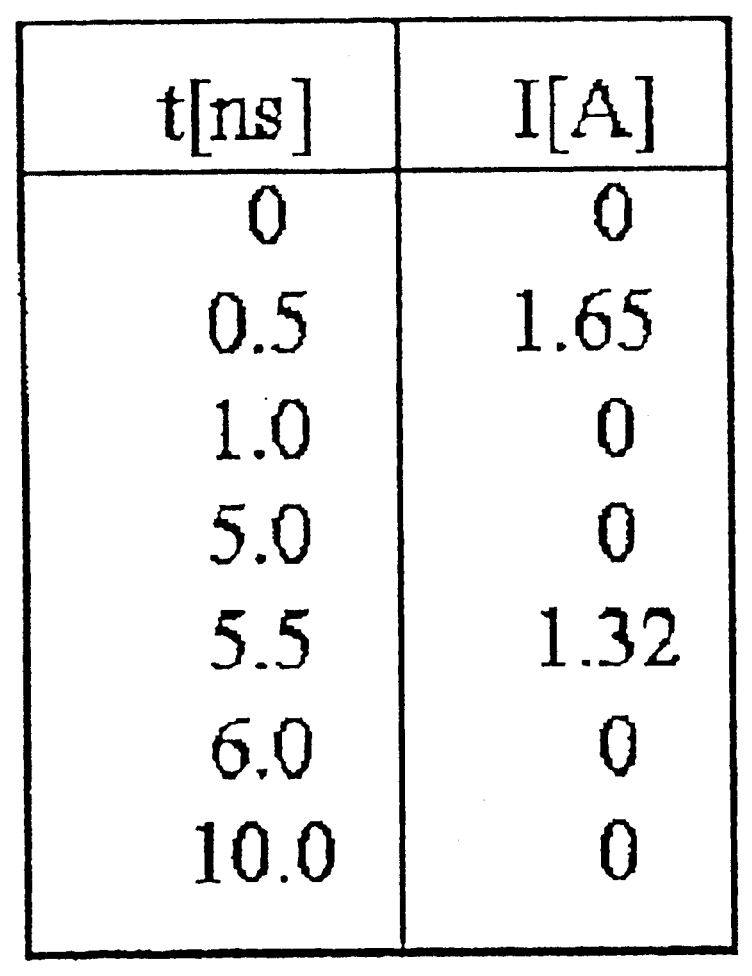
Figure 24:
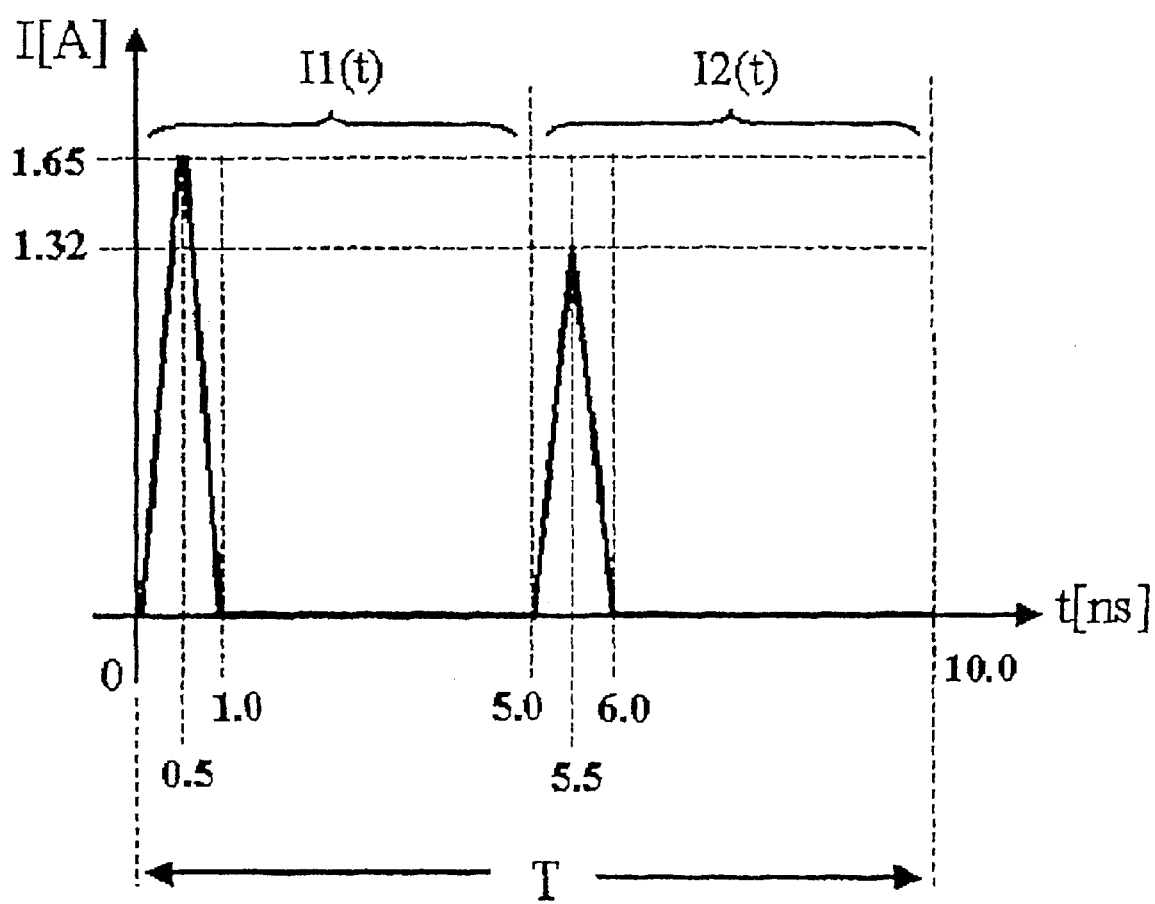
FIG. 24 is a diagram illustrative of waveforms of FIG. 23.

FIG. 23 is a diagram illustrative of a table for respective current values over times for currant waveforms stored in the data base of the system shown in FIG. 18. FIG. 24 is a diagram illustrative of waveforms of FIG. 23. The waveform shown in FIG. 24 is an example of the simple waveforms.

FIG. 25 is a diagram of a model outputted from an output device, wherein current variations for two cycles, for example, 20 nanoseconds. The data base 45 stores the current waveform informations and the voltage value of 3.3 V. This model is used for simulating the electromagnetic interference.

If the model of FIG. 12 is used for the sequential processes of FIG. 14, the model template is modified.

It is also possible that not only the program for preparing the model but also the simulation program for simulating the electromagnetic interference may be stored in the storage medium, so that the programs are executed to output the current distribution and electromagnetic field distribution over the printed circuit board.

It is optional to select either one of the models shown in FIGS. 9 and 12. If the model shown in FIG. 9 is selected, then the program shown in FIG. 11 is used. If the model shown in FIG. 12 is selected, then the program shown in FIG. 14 is used.

As described above, the model for the semiconductor integrated circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures. This allows the maker to present the model to the user.

Eighth Embodiment

Figure 26:
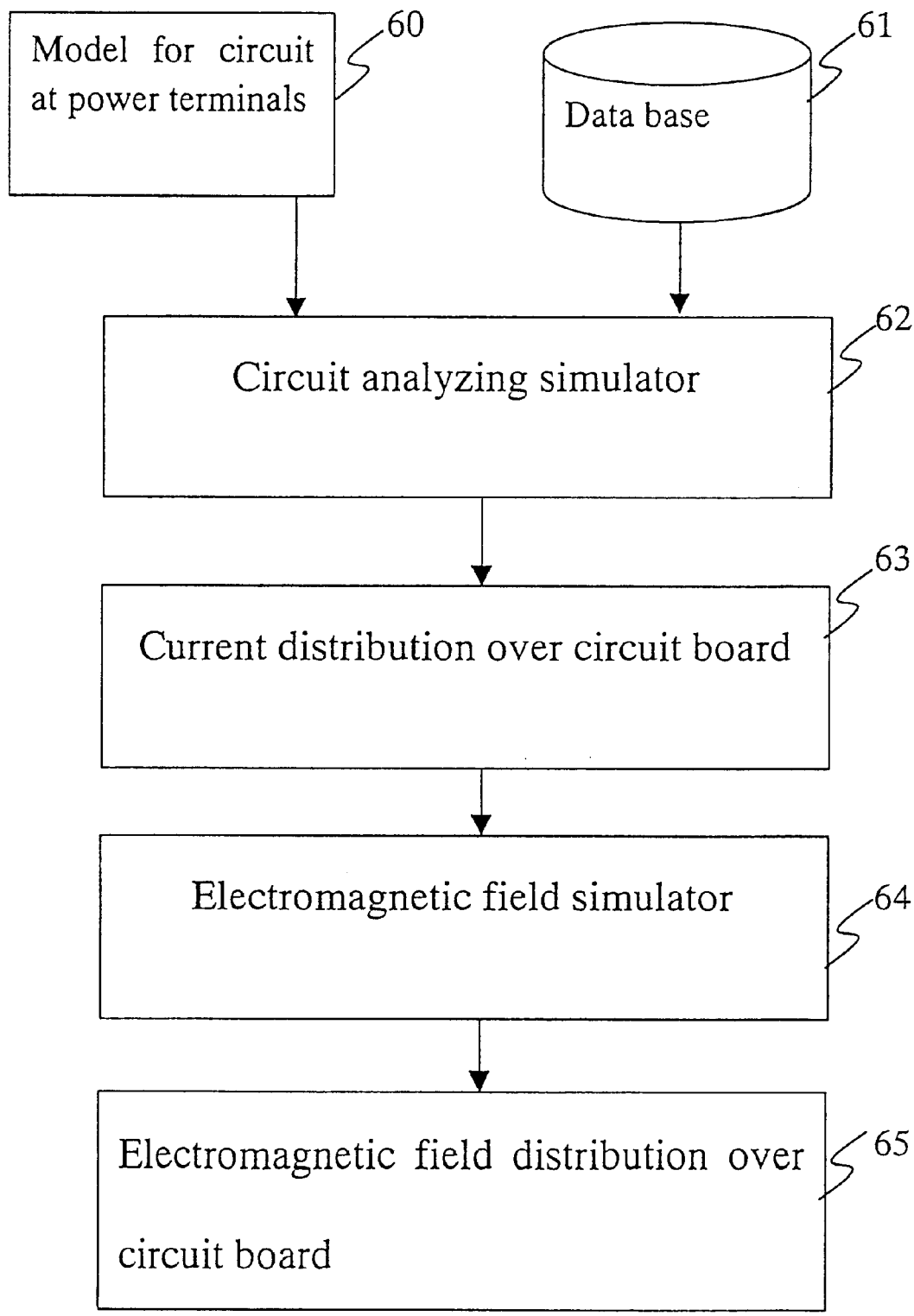
FIG. 26 is a flow chart of processes executed by a simulator for simulating the electromagnetic interference based on the model prepared in accordance with the novel method of the present invention.

An eighth embodiment according to the present invention will be described in detail with reference to the drawings. FIG. 26 is a flow chart of processes executed by a simulator for simulating the electromagnetic interference based on the model prepared in accordance with the novel method of the present invention. The simulator includes a circuit analyzing simulator 62 and an electromagnetic field analyzing simulator 64. The circuit analyzing simulator 62 may be a simulation program with integrated circuit emphasis (SPICE).

A package software "RADIA-WB PACKAGE" commercially available from Applied Simulation Technology was used as a simulator. The package software includes a circuit analyzing tool "ApsimSPICE" which serves as the circuit analyzing simulator 62 for obtaining the current distribution over the circuit board. The package software also includes an electromagnetic field analyzing tool "RADIA" which serves as the electromagnetic field analyzing simulator 64 for obtaining the electromagnetic field distribution from the current distribution.

Data for the model 60 outputted from the output device 52 of FIG. 18 and data for circuit connection and element informations 61 are entered into the simulator 62 (SPICE). The simulator 62 obtains the current distribution 63 over the printed board. The current distribution 63 is entered into the electromagnetic analyzing simulator 64, so that the electromagnetic analyzing simulator 64 obtains the electromagnetic field distribution 65 over the circuit board.

Figure 27:
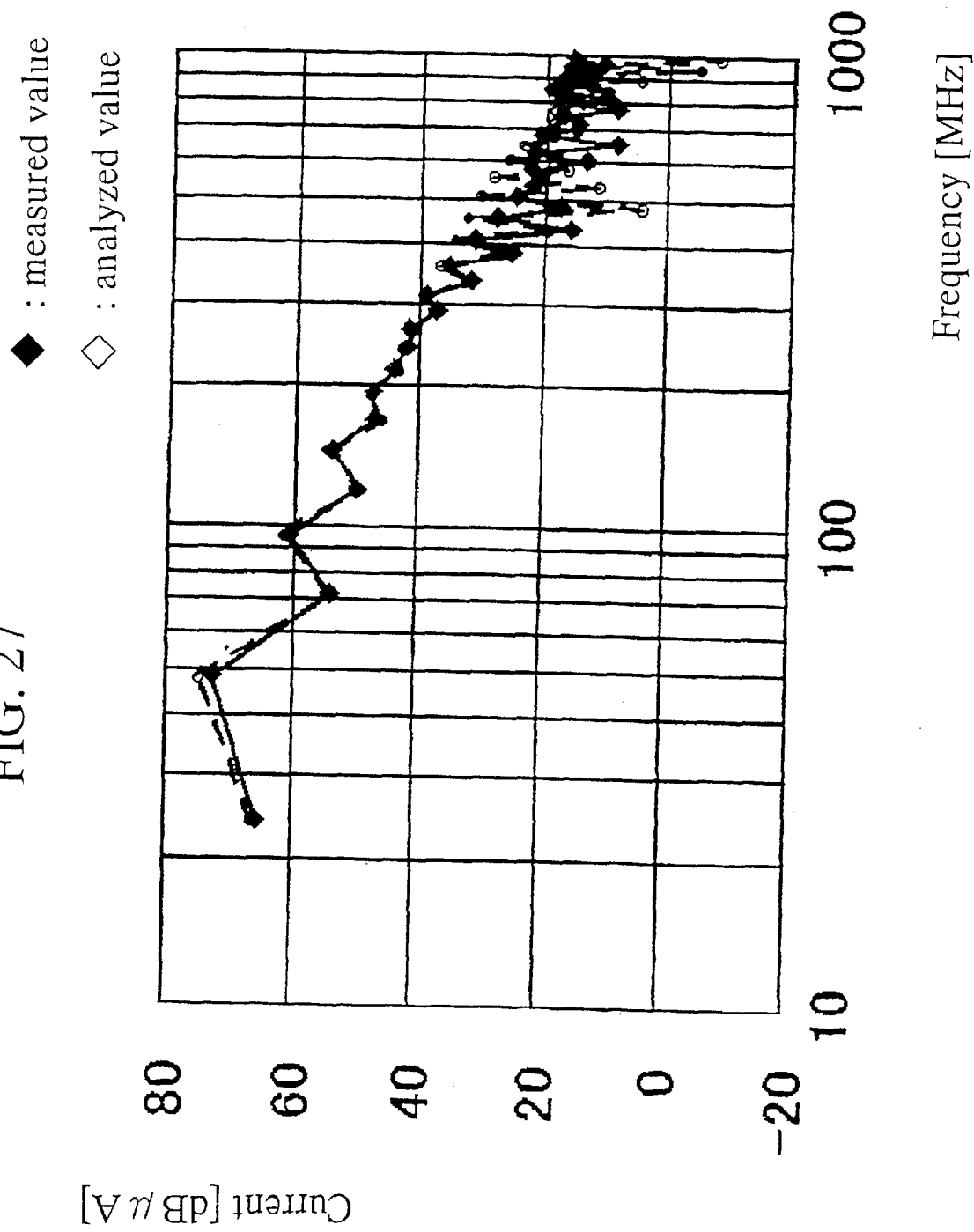
FIG. 27 is a diagram of analyzed and measured current variations over frequency, wherein the current variation is analyzed by the programs of the present invention.

FIG. 27 is a diagram of analyzed and measured current variations over frequency, wherein the current variation is analyzed by the programs of the present invention. ● represents the actually measured current at a point of the circuit board, wherein the measurement is made by a magnetic field probe. ○ represents the current-frequency spectrum obtained by the Fourier transformation from the current waveforms over time at the point of the circuit board. The simulated result well corresponds to the actually measured results.

As described above, the model for the semiconductor integrated circuit at power terminal for simulating the electromagnetic interference is described in a description format using the variable resistance and the load capacitance. The variable resistance and the load capacitance are obtained based on variations in the currents flowing between the power terminals. Namely, the model for the semiconductor integrated circuit may be prepared based on the currents flowing between the power terminals. This allows an automatic preparation of the model, which is free of any confidential informations for circuit configurations and device structures. This allows the maker to present the model to the user.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A method of forming a model for a circuit for simulating an electromagnetic interference, said model being described by a combination of at least one variable resistance and at least one load capacitance, wherein a variable resistance value of said at least one variable resistance and a load capacitance value of said at least one load capacitance are obtained based on at least one current flowing through at least one current path between at least one set of power terminals, wherein said model includes
at least one set of first and second power terminals;
a first series connection of first and second variable resistances between said first and second power terminals;
a second series connection of first and second load capacitances between said first and second power terminals, and a first intermediate node between said first and second variable resistances being connected to a second intermediate node between said first and second load capacitances, wherein a first variable resistance value of said first variable resistance and a second load capacitance value of said second load capacitance are obtained based on a first current which flows from said first power terminal through said first variable resistance and said second load capacitance to said second power terminal, and wherein a second variable resistance value of said second variable resistance and a first load capacitance value of said first load capacitance are obtained based on a second current which flows from said first power terminal through said first load capacitance and said second variable resistance and to said second power terminal.

2. The method as claimed in claim 1,
wherein said first load capacitance value is obtained by the step of:
integrating said second current over time to obtain a charge quantity; and
dividing said charge quantity with a direct current voltage between said first and second power terminals, and
wherein said second load capacitance value is obtained by the step of:
integrating said first current over time to obtain a charge quantity; and
dividing said charge quantity with a direct current voltage between said first and second power terminals.

3. The method as claimed in claim 1,
wherein a current Ir1(t) flowing through said first variable resistance and a current Ir2(t) flowing through said second variable resistance are obtained from equations (1) and (2), $$Ir1(t)=I1(t)\times(C1+C2)/C2 \qquad (1)$$
$$Ir2(t)=I2(t)\times(C1+C2)/C1 \qquad (2)$$

where C1 and C2 are first and second load capacitance values of said first and second load capacitances, and
wherein a resistance Rr1(t) of said first variable resistance and a resistance Rr2(t) of said second variable resistance are obtained from equations (3) and (4), $$Rr1(t)=V1(t)/Ir1(t) \qquad (3)$$
$$Rr2(t)=V2(t)/Ir2(t) \qquad (4)$$

where V1 is a voltage across the first variable resistance and V2 is a voltage across the second variable resistance.

4. The method as claimed in claim 1, wherein said model further includes:
a first switch between said first load capacitance and said first power terminal;
a second switch between said second load capacitance and said second power terminal;
a first by-pass in parallel to said first load capacitance, and said first by-pass comprising a series connection of a third switch and a first constant resistance;
a second by-pass in parallel to said second load capacitance, and said second by-pass comprising a series connection of a fourth switch and a second constant resistance; and
a controller electrically coupled to said first to fourth switches for controlling ON-OFF operations of said first to fourth switches.

5. The method as claimed in claim 4, wherein a resistance Rrd1(t) of said first variable resistance and a resistance Rrd2(t) of said second variable resistance are obtained from equations (5) and (6), $$Rrd1(t)=V1(t)/I1(t) \qquad (5)$$
$$Rrd2(t)=V2(t)/I2(t) \qquad (6)$$

where V1 is a voltage across the first variable resistance and V2 is a voltage across the second variable resistance, and I1(t) is the first current, and I2(t) is the second current.

6. The method as claimed in claim 1, wherein plural sets of said first and second currents appear in one cycle, and the same number of models as said plural sets are prepared, wherein one of said models is prepared from corresponding one of said plural sets, and said models are connected in parallel to each other between said first and second power terminals.

7. A method of forming a model for a circuit for simulating an electromagnetic interference, said model being described by a combination of at least one variable resistance and at least one load capacitance, wherein a variable resistance value of said at least one variable resistance and a load capacitance value of said at least one load capacitance are obtained based on at least one current flowing through at least one current path between at least one set of power terminals, wherein said model includes at least one set of first and second power terminals;
a first series connection of first and second variable resistances between said first and second power terminals;
a second series connection of first and second load capacitances between said first and second variable resistances being connected to second intermediate node between said first and second load capacitances, wherein a first variable resistance value of said first variable resistance and a second load capacitance value of said second load capacitance are obtained based on a first current which flows from said first power terminal through said first variable resistance and said second load capacitance to said second power terminal, and wherein a second variable resistance value of said second variable resistance and a first load capacitance value of said first load capacitance are obtained based on a second current which flows from said first power terminal through said first load capacitance and said second variable resistance and to said second power terminal, and wherein said circuit is divided into a plurality of sub-blocks, and the same number of models as said sub-blocks are prepared, and said models correspond to the sub-blocks respectively.

8. The method as claimed in claim 7, wherein said circuit has a plurality of different power systems, and said circuit is divided into the same number of sub-blocks as said power systems, and said sub-blocks correspond to said power systems, and the same number of models as said sub-blocks are prepared, and said models correspond to the sub-blocks respectively.

9. The method as claimed in claim 1, wherein said circuit comprises a semiconductor integrated circuit.

10. A model for a circuit for simulating an electromagnetic interference, said model being described by a combination of at least one variable resistance and at least one load capacitance, wherein a variable resistance value of said at least one variable resistance and a load capacitance value of said at least one load capacitance depends on at least one current flowing through a least one current path between at least one set of power terminals, wherein said model includes at least one set of first and second power terminals;

a first series connection of first and second variable resistances between said first and second power terminals;

a second series connection of first and second load capacitances between said first and second power terminals, and a first intermediate node between said first and second variable resistances being connected to a second intermediate node between said first and second load capacitances, wherein first variable resistance value of said first variable resistance and a second load capacitance value of said second load capacitance depend on a first current which flows from said first lower terminal through said first variable resistance and said second load capacitance to said second power terminal, and wherein a second variable resistance value of said second variable resistance and a first load capacitance value of said first load capacitance depend on a second current which flows from said first power terminal through said first load capacitance and said second variable resistance and to said second power terminal.

11. The model as claimed in claim 10, wherein said first load capacitance value is obtained by the step of:
integrating said second current over time to obtain a charge quantity; and
dividing said charge quantity with a direct current voltage between said first and second power terminals, and wherein said second load capacitance value is obtained by the step of:
integrating said first current over time to obtain a charge quantity; and
dividing said charge quantity with a direct current voltage between said first and second power terminals.

12. The model as claimed in claim 10, wherein a current Ir1(t) flowing through said first variable resistance and a current Ir2(t) flowing through said second variable resistance depend on equations (1) and (2), $$Ir1(t)=I1(t)\times(C1+C2)/C2 \tag{1}$$

$$Ir2(t)=I2(t)\times(C1+C2)/C1 \tag{2}$$

where C1 and C2 are first and second load capacitance values of said first and second load capacitances, and wherein a resistance Rr1(t) of said first variable resistance and a resistance Rr2(t) of said second variable resistance depend on equations (3) and (4), $$Rr1(t)=V1(t)/Ir1(t) \tag{3}$$

$$Rr2(t)=V2(t)/Ir2(t) \tag{4}$$

where V1 is a voltage across the first variable resistance and V2 is a voltage across the second variable resistance.

13. The model as claimed in claim 10, wherein said model further includes:

a first switch between said first load capacitance and said first power terminal;

a second switch between said second load capacitance and said second power terminal;

a first by-pass in parallel to said first load capacitance, an said first by-pass comprising a series connection of a third switch and a first constant resistance;

a second by-pass in parallel to said second load capacitance, and said second by-pass comprising a series connection of a fourth switch and a second constant resistance; and a controller electrically coupled to said first to fourth switches for controlling ON-OFF operations of said first to fourth switched.

14. The model as claimed in claim 13, wherein a resistance Rrd1(t) of said first variable resistance and a resistance Rrd2(t) of said second variable resistance depend on equations (5) and (6), $$Rrd1(t)=V1(t)/I1(t) \tag{5}$$

$$Rrd2(t)=V2(t)/I2(t) \tag{6}$$

where V1 is a voltage across the first variable resistance and V2 is a voltage across the second variable resistance, and I1(t) is the first current, and I2(t) is the second current.

15. The model as claimed in claim 10, wherein plural sets of said first and second currents appear in one cycle, and the same number of models as said plural sets are present, wherein one of said models is present in correspondence with said plural sets, and said models are connected in parallel to each other between said first and second power terminals.

16. A model for a circuit for simulating an electromagnetic interference, said model being described by a combination of at least one variable resistance and at least one load capacitance, wherein a variable resistance value of said at least one variable resistance and a load capacitance value of said at least one load capacitance depends on at least one current flowing through a least one current path between at least one set of power terminals, wherein said model includes
at least one set of first and second power terminals;
a first series connection of first and second variable resistances between said first and second power terminals;

a second series connection of first and second load capacitances between said first and second variable resistances being connected to second intermediate node between said first and second load capacitances, wherein a first variable resistance value of said first variable resistance and a second load capacitance value of said second load capacitance are obtained based on a first current which flows from said first power terminal through said first variable resistance and said second load capacitance to said second power terminal, and wherein a second variable resistance value of said second variable resistance and a first load capacitance value of said first load capacitance are obtained based on a second current which flows from said first power terminal through said first load capacitance and said second variable resistance and to said second power terminal, and wherein said circuit is divided into a plurality of sub-blocks, and the same number of models as said sub-blocks are present, and said models correspond to the sub-blocks respectively.

17. The model as claimed in claim 16, wherein said circuit has a plurality of different power systems, and said circuit is divided into the same number of sub-blocks as said power systems, and said sub-blocks correspond to said power systems, and the same number of models as said sub-blocks are present, and said models correspond to the sub-blocks respectively.

18. The model as claimed in claim 10, wherein said circuit comprises a semiconductor integrated circuit.

19. A computer program for forming a model for a circuit for simulating an electromagnetic interference, said model being described by a combination of at least one variable resistance and at least one load capacitance, wherein a variable resistance value of said at least one variable resistance and a load capacitance value of said at least one load capacitance are obtained based on at least one current flowing through at least one current path between at least one set of lower terminals, and wherein said model includes
at least one set of first and second power terminals;
a first series connection of first and second variable resistances between said first and second power terminals;
a second series connection of first and second load capacitance between said first and second power terminals, and a first intermediate node between said first and second variable resistances being connected to a second intermediate node between said first and second load capacitances, wherein a first variable resistance value of said first variable resistance and a second load capacitance value of said second load capacitance are obtained based on a first current which flows from said first power terminal through said first variable resistance and said second load capacitance to said second power terminal, and wherein a second variable resistance value of said second variable resistance and a first load capacitance value of said first load capacitance are obtained based on a second current which flows from said first power terminal through said first load capacitance and said second variable resistance and to said second power terminal.

20. The computer program as claimed in claim 19,
wherein said first load capacitance value is obtained by the step of:
integrating said second current over time to obtain a charge quantity; and
dividing said charge quantity with a direct current voltage between said first and second power terminals, and wherein said second load capacitance value is obtained by the step of:
integrating said first current over time to obtain a charge quantity; and
dividing said charge quantity with a direct current voltage between said first and second power terminals.

21. The computer program as claimed in claim 19,
wherein a current $Ir1(t)$ flowing through said first variable resistance and a current $Ir2(t)$ flowing through said second variable resistance are obtained from equations (1) and (2), $$Ir1(t)=I1(t) \times (C1+C2)/C2 \tag{1}$$

$$Ir2(t)=I2(t) \times (C1+C2)/C1 \tag{2}$$

where C1 and C2 are first and second load capacitance values of said first and second load capacitances, and wherein a resistance $Rr1(t)$ of said first variable resistance and a resistance $Rr2(t)$ of said second variable resistance are obtained from equations (3) and (4), $$Rr1(t)=V1(t)/Ir1(t) \tag{3}$$

$$Rr2(t)=V2(t)/Ir2(t) \tag{4}$$

where V1 is a voltage across the first variable resistance and V2 is a voltage across the second variable resistance.

22. The computer program as claimed in claim 19, wherein said model further includes:
a first switch between said first load capacitance and said first power terminal;
a second switch between said second load capacitance and said second power terminal;
a first by-pass in parallel to said first load capacitance, and said first by-pass comprising a series connection of a third switch and a first constant resistance;
a second by-pass in parallel to said second load capacitance, and said second by-pass comprising a series connection of a fourth switch and a second constant resistance; and
a controller electrically coupled to said first to fourth switches for controlling ON-OFF operations of said first fourth switches.

23. The computer program as claimed in claim 22, wherein a resistance $Rrd1(t)$ of said first variable resistance and a resistance $Rrd2(t)$ of said second variable resistance are obtained from equations (5) and (6), $$Rrd1(t)=V1(t)/I1(t) \tag{5}$$

$$Rrd2(t)=V2(t)/I2(t) \tag{6}$$

where V1 is a voltage across the first variable resistance and V2 is a voltage across the second variable resistance, and $I1(t)$ is the first current, and $I2(t)$ is the second current.

24. The computer program as claimed in claim 19, wherein plural sets of said first and second currents appear in one cycle, and the same number of models as said plural sets are prepared, wherein one of said models is prepared from corresponding one of said plural sets, and said models are connected in parallel to each other between said first and second power terminals.

25. A computer program for forming a model for a circuit for simulating an electromagnetic interference, said model being described by a combination of at least one variable resistance and at least one load capacitance, wherein a variable resistance value of said at least one variable resistance and a load capacitance value of said at least one load capacitance are obtained based on at least one current flowing through at least one current path between at least one set of power terminals, wherein said model includes at least one set of first and second power terminals;

a first series connection of first and second variable resistances between said first and second power terminals;

a second series connection of first and second load capacitances between said first and second variable resistances being connected to second intermediate node between said first and second load capacitances, wherein a first variable resistance value of said first variable resistance and a second load capacitance value of said second load capacitance are obtained based on a first current which flows from said first power terminal through said first variable resistance and said second load capacitance to said second power terminal, and wherein a second variable resistance value of said second variable resistance and a first load capacitance value of said first load capacitance are obtained based on a second current which flows from said first power terminal through said first load capacitance and said second variable resistance and to said second power terminal, and wherein said circuit is divided into a plurality of sub-blocks, and the same number of models as said sub-blocks are prepared, and said models correspond to the sub-blocks respectively.

26. The computer program as claimed in claim 25, wherein said circuit has a plurality of different power systems, and said circuit is divided into the same number of sub-blocks as said power systems, and said sub-blocks correspond to said power systems, and the same number of models as said sub-blocks are prepared, and said models correspond to the sub-blocks respectively.

27. The computer program as claimed in claim 19, wherein said circuit comprises a semiconductor integrated circuit.

\* \* \* \* \*